(12) United States Patent
Yang et al.

(10) Patent No.: US 6,660,588 B1
(45) Date of Patent: Dec. 9, 2003

(54) HIGH DENSITY FLOATING GATE FLASH MEMORY AND FABRICATION PROCESSES THEREFOR

(75) Inventors: Nian Yang, San Jose, CA (US);
Zhigang Wang, Santa Clara, CA (US);
Hyeon-seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/244,229

(22) Filed: Sep. 16, 2002

(51) Int. Cl.[7] .................................................. H01L 21/336
(52) U.S. Cl. ......................................... 438/257; 438/593
(58) Field of Search ................................. 438/257, 261, 438/305, 316, 593, 259, 594

(56) References Cited

U.S. PATENT DOCUMENTS

| | | | |
|---|---|---|---|
| 5,596,531 A | 1/1997 | Liu et al. ............... 365/185.31 |
| 5,598,369 A | 1/1997 | Chen et al. ............ 365/185.27 |
| 5,617,357 A | 4/1997 | Haddad et al. ........ 365/185.27 |
| 5,869,858 A | 2/1999 | Ozawa et al. ............... 257/296 |
| 5,888,867 A | 3/1999 | Wang et al. ................. 438/257 |
| 5,907,775 A * | 5/1999 | Tseng |
| 6,069,381 A | 5/2000 | Black et al. ................. 257/316 |
| 6,140,688 A | 10/2000 | Gardner et al. ............. 257/412 |
| 6,272,050 B1 | 8/2001 | Cunningham et al. . 365/185.28 |
| 6,351,428 B2 | 2/2002 | Forbes .................. 365/230.06 |
| 6,384,451 B1 | 5/2002 | Caywood ..................... 257/321 |
| 6,399,444 B1 | 6/2002 | Cappelletti .................. 438/260 |
| 6,534,820 B2 * | 3/2003 | Hofmann et al. |
| 2002/0003252 A1 | 1/2002 | Iyer ........................... 257/315 |

* cited by examiner

Primary Examiner—Phuc T. Dang
(74) Attorney, Agent, or Firm—Renner, Otto, Boisselle & Sklar, LLP

(57) ABSTRACT

A process for fabrication of a floating gate flash memory device, and the device made thereby, including providing a semiconductor substrate; forming a pad dielectric layer overlying the substrate; forming a hard mask layer overlying the pad dielectric layer; forming an initial trench through the hard mask layer, wherein the initial trench has an initial lateral extent $L_i$ defined by opposite hard mask sidewalls in the hard mask layer; reducing the initial lateral extent $L_i$ of the initial trench to define a reduced trench having a reduced lateral extent $L_{rx}$, wherein x is at least one; and filling the reduced trench with a floating gate material.

49 Claims, 11 Drawing Sheets

HIGH DENSITY FLOATING GATE FLASH MEMORY AND FABRICATION PROCESSES THEREFOR

TECHNICAL FIELD

The present invention relates to a structure and a process for fabrication of a semiconductor device including a metal conductive element, in particular to a structure and process for fabrication of a floating gate in a flash memory device.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions.

However, due to complex process technologies used in fabrication of state of the art flash memories, further improvement of memory density has become more challenging.

A floating gate flash memory device includes a floating gate electrode upon which electrical charge is stored. The floating gate electrode is formed on a tunnel oxide layer which overlies a channel region residing between the source and drain regions in a semiconductor substrate. The floating gate electrode together with the source and drain regions form an enhancement transistor. Typically, the floating gate electrode has been formed of polysilicon. Metal floating gates have also been used.

Referring to FIG. 1, there is schematically shown in cross-section a conventional floating gate flash memory device or cell 10 suitable for use in a floating gate flash EEPROM device. The cell 10 includes source/drain regions 12 and 14 located in a semiconductor substrate 16. The source and drain regions 12 and 14 are separated by a channel region 18. A "tunnel" or bottom dielectric material layer 20 overlies the source and drain regions 12 and 14 and the channel region 18. A floating gate electrode 22 overlies the tunnel dielectric layer 20. The floating gate electrode 22 may be polysilicon or polysilicon-germanium, a metal or a silicide, for example. The floating gate electrode 22 is separated from a control gate electrode 26 by an interlayer dielectric layer 24. The control gate electrode 26, the interlayer dielectric 24 and the floating gate electrode 22 form a floating gate flash memory cell structure, which may be referred to as a stack gate.

It should be noted that the floating-gate flash memory cell 10 is a symmetrical device. Therefore, the use of the terms "source" and "drain," as they are commonly used with conventional transistor devices, may be confusing. For example, each floating gate flash memory cell 10 comprises a pair of adjacent source/drain regions 12, 14. During program, erase and read functions, one of these two source/drain regions 12/14 will serve as a source, while the other will serve as a drain. In conventional transistor terminology, electrons travel from the source to the drain. Which of the source/drain regions 12/14 functions as a source, and which of the source/drain regions 12/14 functions as a drain, depends on the function being performed and on the manner in which the floating gate 22 is being addressed (i.e., whether it is being programmed, erased or read). Thus, it is to be understood that references to source or drain may refer to different structures at different times.

In a floating gate flash memory device, electrons are transferred to the floating gate electrode 22 through the tunnel dielectric layer 20 overlying the channel region 18 of the floating gate flash memory cell 10. The electron transfer is initiated by either hot electron injection, or by Fowler-Nordheim tunneling. In either electron transfer mechanism, a voltage potential is applied to the floating gate electrode 22 by the overlying control gate electrode 26. The control gate electrode 26 is capacitively coupled to the floating gate electrode 22, such that a voltage applied on the control gate electrode 26 is coupled to the floating gate electrode 22 through the interlayer dielectric layer 24, which may be referred to as the interpoly dielectric when both the floating gate and the control gate are formed of or comprise polysilicon. The floating gate flash memory device 10 is programmed by applying a high positive voltage to the control gate electrode 26, and a lower positive voltage to the drain region 14, which transfers electrons from the channel region 18 to the floating gate electrode 22. Electron injection carries negative charge into the floating gate. This injection mechanism is normally induced by grounding the source region 12 and a bulk portion of the substrate 16, applying a relatively high positive voltage to the control gate electrode 26, for example, +12 Volts (V), to create an electron attracting field and applying a positive voltage of moderate magnitude (i.e., approximately +6 V to +9 V) to the drain region 14 in order to generate "hot" (high energy) electrons. After sufficient negative charge accumulates on the floating gate 22, the negative potential of the floating gate 22 raises the threshold voltage of its field effect transistor (FET) and inhibits current flow through the channel region 18 during a subsequent "read" mode. The magnitude of the read current is used to determine whether an EEPROM cell is programmed or not. Typically, in the read mode, a relatively low positive voltage, for example, +1.5 V, is applied to the drain region 14, +5 V is applied to the control gate electrode 26 and 0 V is applied to the source region 12 of the floating gate flash memory cell 10.

The act of discharging the floating gate 22 is called the erase function for a flash EEPROM cell. This erasure function is typically carried out by a Fowler-Nordheim tunneling mechanism between the floating gate 22 and the source region 12 of the transistor (source erase or negative gate erase) or between the floating gate 22 and the substrate 16 via the channel region 18 (channel erase). The "flash" EEPROM derives its name from the feature that all of the cells in a row can be erased at once.

One concern with floating gate flash memories is variation in Vt, the threshold voltage of the floating gate cell. For example, if the target Vt is 3 v, the range of actual Vt observed may be from 2.7 v to 3.3 v. This is undesirable, since such variation creates uncertainty as to the program state of the cell. Conventional floating gate cells use lightly doped polysilicon as the charge storage medium. If the doping is non-uniform, the non-uniformity can increase the range of Vt, and there may be a voltage drop across the floating gate if the doping level is too low. In addition, there is the problem of the depletion effect which may be observed in semiconductor materials such as polysilicon. Such problems may be avoided by use of a metal floating gate.

A second concern with floating gate flash memories is the work function of the floating gate material, and the energy barrier height which must be overcome by electrons during programming, reading and erasing floating gate cells.

A continuing concern in the industry is reduction of size and increase in density of components of semiconductor devices, and in particular, in flash memory devices. One way to increase higher density of programmable/erasable memory bits is to minimize the memory cell pitch. However, the present limits of lithography have been encountered in the drive towards ever-smaller and more densely packed memory cells. Thus, numerous challenges remain in the fabrication of material layers for use in flash memory devices. What is needed in the art is a process which allows for fabrication of flash memory device elements at the smallest possible dimensions. Reduction of the size of the central elements of such devices is a needed component of such improvements. Such size reduction should also be accompanied by improvements in the quality of the elements, since the tolerance for error and impurities is reduced even faster than the desired reductions in size and increases in density.

Thus, what is needed is a process for fabrication of a floating gate flash memory device which provides both size reduction and maintenance or improvement of the quality of the elements of the device.

DISCLOSURE OF INVENTION

The present invention relates to processes for forming floating gate flash memory devices having reduced size and increased performance, which address the problems of the prior art. In one embodiment, the present invention relates to a process for fabrication of a floating gate flash memory device including steps of providing a semiconductor substrate; forming a pad dielectric layer overlying the substrate; forming a hard mask layer overlying the pad dielectric layer; forming an initial trench through the hard mask layer and the pad dielectric layer, wherein the initial trench has an initial lateral extent $L_i$ defined by opposite hard mask sidewalls in the hard mask layer; reducing the initial lateral extent $L_i$ of the initial trench to define a reduced trench having a reduced lateral extent $L_{rx}$, wherein x is at least one; forming a reverse tunnel dielectric layer in the reduced trench; and filling the reduced trench with a floating gate material.

In another embodiment, the present invention relates to a process for fabrication of a floating gate flash memory device including steps of providing a semiconductor substrate; forming a pad dielectric layer overlying the substrate; forming a hard mask layer overlying the pad dielectric layer; forming an initial trench through the hard mask layer, wherein the initial trench has an initial lateral extent $L_i$ defined by opposite hard mask sidewalls in the hard mask layer; reducing the initial lateral extent $L_i$ of the initial trench to define a reduced trench having a reduced lateral extent $L_{rx}$, wherein x is at least one; and filling the reduced trench with a metal floating gate material.

In still another embodiment, the present invention relates to a process for fabrication of a floating gate flash memory device including steps of providing a semiconductor substrate; forming a pad dielectric layer overlying the substrate; forming a hard mask layer overlying the pad dielectric layer; forming an initial trench through the hard mask layer, wherein the initial trench has an initial lateral extent $L_i$ defined by opposite hard mask sidewalls in the hard mask layer; depositing a barrier layer in the initial trench; and filling the reduced trench with a metal floating gate material.

In yet another embodiment, the present invention relates to a process for fabrication of a floating gate flash memory device including steps of providing a semiconductor substrate; forming a pad dielectric layer overlying the substrate; forming a hard mask layer overlying the pad dielectric layer; forming an initial trench through the hard mask layer and the pad dielectric layer, wherein the initial trench has an initial lateral extent $L_i$ defined by opposite hard mask sidewalls in the hard mask layer; forming a reverse tunnel dielectric layer in the reduced trench; reducing the initial lateral extent $L_i$ of the initial trench to define a reduced trench having a reduced lateral extent $L_{r1}$; and filling the reduced trench with a metal floating gate material.

In one embodiment, these processes further includes a step of etching to form a stack gate comprising a floating gate and a spacer formed from a portion of the hard mask layer.

The present invention further relates to devices fabricated in accordance with the foregoing processes. In one embodiment, the present invention relates to a floating gate flash memory device including: a) a substrate comprising a source region, a drain region, and a channel region positioned therebetween; b) a reverse tunnel dielectric layer; c) a stack gate comprising a floating gate electrode, hard mask spacers, and at least one of sidewall/spacers, second sidewalls or a barrier layer, wherein the floating gate is positioned above the channel region, with the floating gate separated from the hard mask spacers by the at least one of sidewall/spacers, second sidewalls or a barrier layer, wherein the floating gate is separated from the channel region by the reverse tunnel dielectric layer; and d) a control gate electrode positioned above the floating gate electrode and separated from the floating gate electrode by an interpoly dielectric layer.

In another embodiment, the present invention relates to a floating gate flash memory device including: a) a substrate comprising a source region, a drain region, and a channel region positioned therebetween; b) a stack gate comprising a metal floating gate electrode, hard mask spacers, sidewall/spacers and a barrier layer, wherein the barrier layer includes sidewalls adjacent the metal floating gate, the sidewall/spacers are between the metal floating gate and the hard mask spacers, the metal floating gate is positioned above the barrier layer and the stack gate is separated from the channel region by a pad dielectric layer; and c) a control gate electrode positioned above the floating gate electrode and separated from the floating gate electrode by an interpoly dielectric layer.

In still another embodiment, the present invention relates to a floating gate flash memory device including: a) a substrate comprising a source region, a drain region, and a channel region positioned therebetween; b) a stack gate comprising a metal floating gate electrode, hard mask spacers and a barrier layer, wherein the barrier layer includes sidewalls separating the metal floating gate from the hard mask spacers, the metal floating gate is positioned above the barrier layer and the stack gate is separated from the channel region by a pad dielectric layer; and c) a control gate electrode positioned above the floating gate electrode and separated from the floating gate electrode by an interpoly dielectric layer.

In yet another embodiment, the present invention relates to a floating gate flash memory device including: a) a substrate comprising a source region, a drain region, and a channel region positioned therebetween; b) a reverse tunnel dielectric layer; c) a stack gate comprising a metal floating gate electrode, hard mask spacers, and a barrier layer, wherein the barrier layer includes sidewalls separating the metal floating gate from the hard mask spacers, the metal floating gate is positioned above the barrier layer and the stack gate is separated from the channel region by the reverse tunnel dielectric layer; and d) a control gate electrode positioned above the floating gate electrode and separated from the floating gate electrode by an interpoly dielectric layer.

Thus, in the present invention, by use of a floating gate, which in some embodiments is a metal floating gate, having its size reduced by addition of sidewalls and/or a barrier layer, a floating gate flash memory device may be fabricated including a floating gate having reduced dimensions by a process which can be easily implemented into current process flows without introducing extensive new equipment, thus achieving a cost reduction or avoiding a cost increase, while increasing the production yield and memory density. The present invention provides for advantages such as (1) reduced memory cell dimensions; (2) easy incorporation into existing processes; (3) improved data retention and reliability in flash memory cells; and (4) avoiding of increased costs in achieving improved performance in smaller memory cells. Thus, the present invention provides an advance in memory storage layer fabrication technology for floating gate flash memory devices, and ensures proper charge retention, while at the same time providing distinct process and economic advantages.

Although described herein in terms of a floating gate flash memory device, the present invention is broadly applicable to fabrication of any semiconductor device that includes a metal structure having reduced dimensions or to any other floating gate flash memory device.

Figure 1:
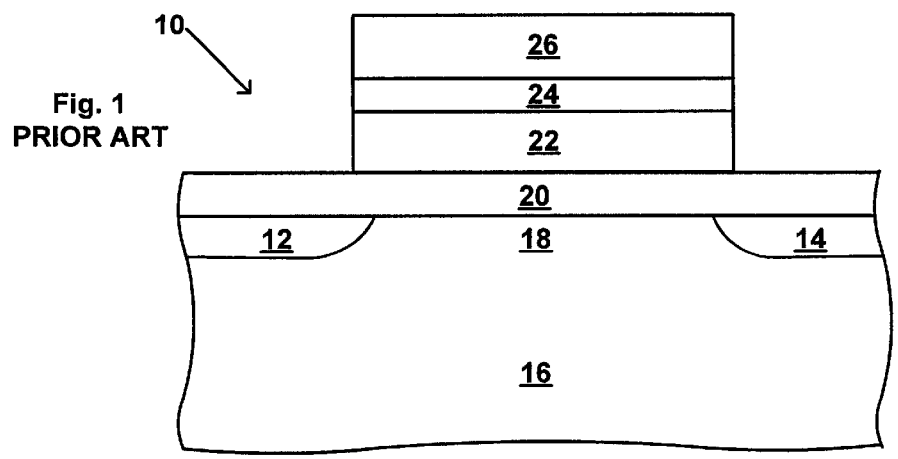
FIG. 1 schematically illustrates, in cross-section, a portion of a semiconductor device containing a conventional floating gate flash memory cell which has conventional dimensions.

It should be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

MODES FOR CARRYING OUT THE INVENTION

As noted in the background, it is desirable to reduce dimensions of semiconductor devices in order to meet the demand for ever-smaller and ever-faster operating devices. The conventional floating gate flash memory device 10 is generally limited by the size limitations imposed by known processes. The present invention relates to a device including a floating gate electrode having significantly reduced size and to a process for making the device.

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

Here and in all numerical values in the specification and claims, the limits of the ranges and ratios may be combined.

As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more. In addition, the high-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or mor of $ZrO_2$, $HfO_2$, $Y_2O_3$, $La_2O_3$. Suitable high-K dielectric materials also include tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric materials. A composite dielectric material generally has a K value greater than 10, as defined above for a high-K dielectric material. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than about 10 may be suitable. In one embodiment, the mixed-metal oxide, metal silicate, metal aluminate or metal mixed-aluminate/silicate is one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

The following description of the devices and processes of the present invention are given in the context of a floating gate flash memory device. It is to be understood that, while the present invention is discussed herein in that context, that this is merely exemplary and is not intended to limit the scope of the present invention. The floating gate structure fabricated by the presently disclosed method is applicable to any semiconductor device in which a structure having a similarly reduced size may be included. The invention is particularly applicable to a floating gate flash memory device described above with reference to FIG. 1, in which the conventional floating gate dimensions need to be reduced in order to obtain a smaller, faster device.

Figure 2:
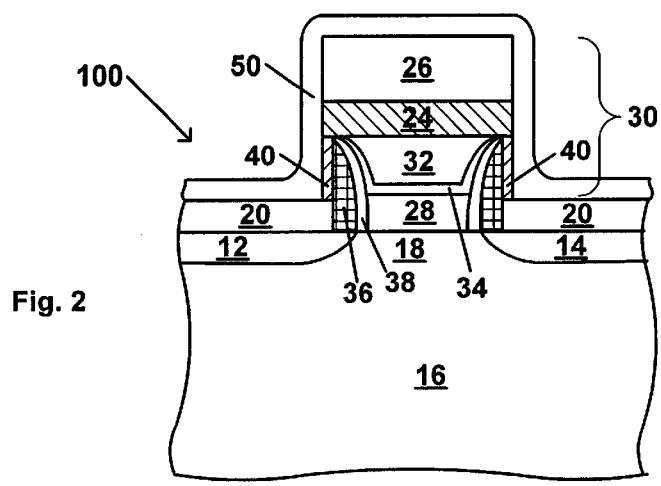
FIG. 2 illustrates, in cross-section, a floating gate flash memory device in accordance with one embodiment of the present invention, including a floating gate and barrier layer, and a revers tunnel dielectric layer, taken along the bitline direction at line 2—2 of FIG. 20.

FIG. 2 illustrates, in cross-section, one embodiment of a floating gate flash memory device 100, including a metal floating gate, in accordance with the invention. As will become apparent from the following description, the embodiment shown in FIG. 2 is but one of a plurality of embodiments which are within the scope of the present invention. As shown in FIG. 2, the device 100 includes a semiconductor substrate 16, in which source and drain regions 12 and 14 have been formed. Together, the source and drain regions 12 and 14 define a channel region 18 therebetween. Portions of the source and drain regions 12 and 14 are overlain by a pad dielectric layer 20. As shown in FIG. 2, in the present invention the device 100 includes the pad dielectric layer 20 which does not extend into the area above the channel region 18, as in the conventional floating gate flash memory device 10 shown in FIG. 1. The term "pad" is used here to emphasize that, in this embodiment, the dielectric layer 20 is not the tunnel dielectric in the floating gate flash memory device of the present invention. Rather, in the device 100, a separate reverse tunnel dielectric layer 28 is formed between the channel region 18 and the overlying floating gate. The reverse tunnel dielectric layer 28 is a "reverse" layer because it is formed at a different point in the process of the present invention than a conventional tunnel dielectric layer would be formed, and may be formed of a material distinct from that used for the pad dielectric layer 20, as described in more detail below.

While FIG. 1 and FIG. 2 are not drawn to scale, the difference in size of the devices shown in FIGS. 1 and 2 is intended to emphasize that the pitch of the floating gate flash memory cell of the present invention is substantially smaller than the pitch of the conventional floating gate flash memory cell.

Referring still to FIG. 2, the device 100 of the present invention includes, above the structures just described, a stack gate 30, which includes a plurality of structures. The stack gate 30 includes a control gate 26 and an interlayer dielectric 24 which, in one embodiment, are substantially similar to the corresponding elements in the conventional floating gate flash memory device 10 shown in FIG. 1. The control gate 30 may be formed of polysilicon, polysilicon-germanium, a metal or other suitable material. The interlayer dielectric 24 may be a standard-K dielectric material such as silicon dioxide, a high-K dielectric material or a composite dielectric material. In the embodiment of the present invention shown in FIG. 2, the stack gate 30 comprises a metal floating gate 32. The metal floating gate 32 is substantially smaller than a conventional floating gate, such as that shown in FIG. 1. The metal floating gate 32 is positioned near or adjacent to hard mask sidewalls 40, a reverse tunnel dielectric layer 28, and sidewall/spacers 36, and in this embodiment, a barrier layer 34 and second sidewalls 38, each of which are described in detail in the following. Some embodiments of the present invention do not include one or more of the barrier layer 34, the sidewall/spacers 36, and the second sidewalls 38. As shown in FIG. 2, in one embodiment, the stack gate 30 is covered by a protective film 50, which may be, for example, a protective dielectric material layer, or a cap layer. In other embodiments (not shown), the portions of the layer 50 may be etched to form outer protective sidewalls on the left and right sides of the stack gate 30 as shown in FIG. 2.

The metal floating gate 32 may include one or more metals described in detail below.

In one embodiment, the metal may be one or more of ruthenium (Ru), ruthenium oxide (RuO$_2$), or an alloy of ruthenium, such as an alloy of ruthenium and tantalum (Ru—Ta). As indicated below, other metals may be used in addition to those mentioned here.

In the stack gate 30, the metal floating gate 32 is adjacent to and defined by elements which may include the sidewall/spacer layer 36, the barrier layer 34, and/or the second sidewalls 38. As shown in FIG. 2, in one embodiment, the metal floating gate 32 is adjacent to the barrier layer 34. When present, the barrier layer 34 may be directly adjacent the metal floating gate 32. However, the barrier layer 34 is optional in the present invention. The barrier layer 34 is included in embodiments of the present invention in which there is a possibility the metal of the metal floating gate 32 may migrate into nearby structures, such as the reverse tunnel dielectric layer 28, which could result in changes in the electrical or other functions thereof. The barrier layer 34 may include any material which forms a barrier to the specific metal used in the metal floating gate 32. For example, in one embodiment, when the metal floating gate 32 includes Ru, a particularly effective barrier layer material is ruthenium titanium nitride (RuTiN). Additional barrier materials are described in more detail below.

The stack gate 30, in the embodiment shown in FIG. 2, further includes the sidewall/spacers 36, which are deposited adjacent to the trench sidewalls, formed of the hard mask layer 40 and the pad oxide layer 20. The hard mask layer 40 is used in the process of forming the metal floating gate 32 and associated structures, and a portion thereof remains as a sidewall in the stack gate 30, as described in more detail below.

In some embodiments, such as that shown in FIG. 2, the stack gate 30 further includes the second sidewalls 38. The second sidewalls 38 may be formed by a deposition process or by growing from the sidewall/spacers 36 by, e.g., a thermal oxidation or nitridation or an implantation. In one embodiment, the second sidewalls 38 are formed of the same material and are deposited together with, or in one embodiment, simultaneously with, the reverse tunnel dielectric 28.

In the present invention, the stack gate 30 further comprises the hard mask sidewalls 40 which are formed from the hard mask layer 40, which is used to define the trench in which the elements of the stack gate 30 is comprised.

In accordance with some embodiments of the present invention, as described in detail below, the stack gate 30 includes the floating gate 32 which is substantially smaller than the corresponding conventional floating gate shown in FIG. 1. The reduced size of the floating gate 32 is achieved by the process of the present invention, including formation of the sidewall/spacers 36, and in some embodiments, of the second sidewalls 38 and/or the barrier layer 34. As a result of the process and structures of the present invention, the size of the floating gate structure can be significantly reduced as compared to a similar structure formed without the present invention. These structures, and the processes by which they are formed, are described in more detail below.

In other embodiments, the floating gate material may be polysilicon, polysilicon-germanium, or any other material known for use as a floating gate electrode.

Referring still to FIG. 2, in operation of the floating gate flash memory cell or device 100, electrons are transferred to the floating gate electrode 32 from the channel region 18 through the reverse tunnel dielectric layer 28, when the control gate electrode 26 is appropriately coupled to the floating gate electrode 32 via the interlayer dielectric 24. A voltage potential applied to the floating gate electrode 28 by the overlying control gate electrode 26 is capacitively coupled to the metal floating gate electrode 32 through the intervening interlayer dielectric 24. The floating gate flash memory device 100 is programmed by applying a high positive voltage to the control gate electrode 26 and a lower positive voltage to the drain region 14, which transfers electrons from the channel region 18 to the floating gate electrode 32. The electrons are stored as a charge in the floating gate electrode 32. Reading the floating gate flash memory device 100 corresponds to reading a conventional device as described above. The steps in operation of the metal floating gate flash memory cell are substantially the same whether the floating gate material is metal, polysilicon, polysilicon-germanium or another material.

Figure 11:
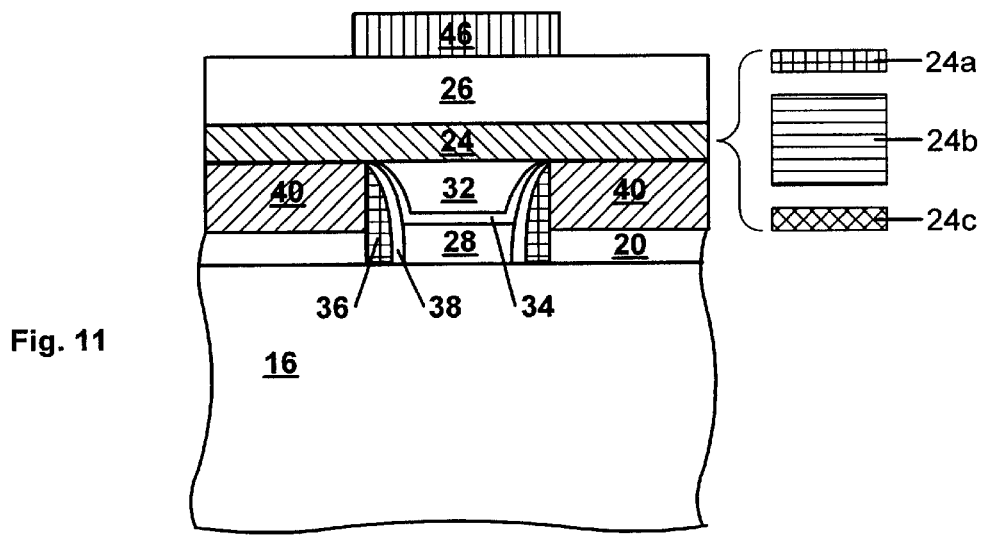
Figure 12:
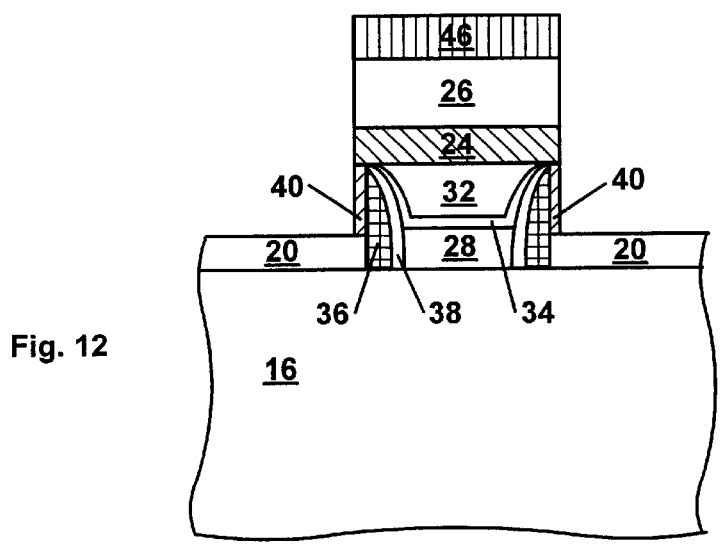
Figure 13:
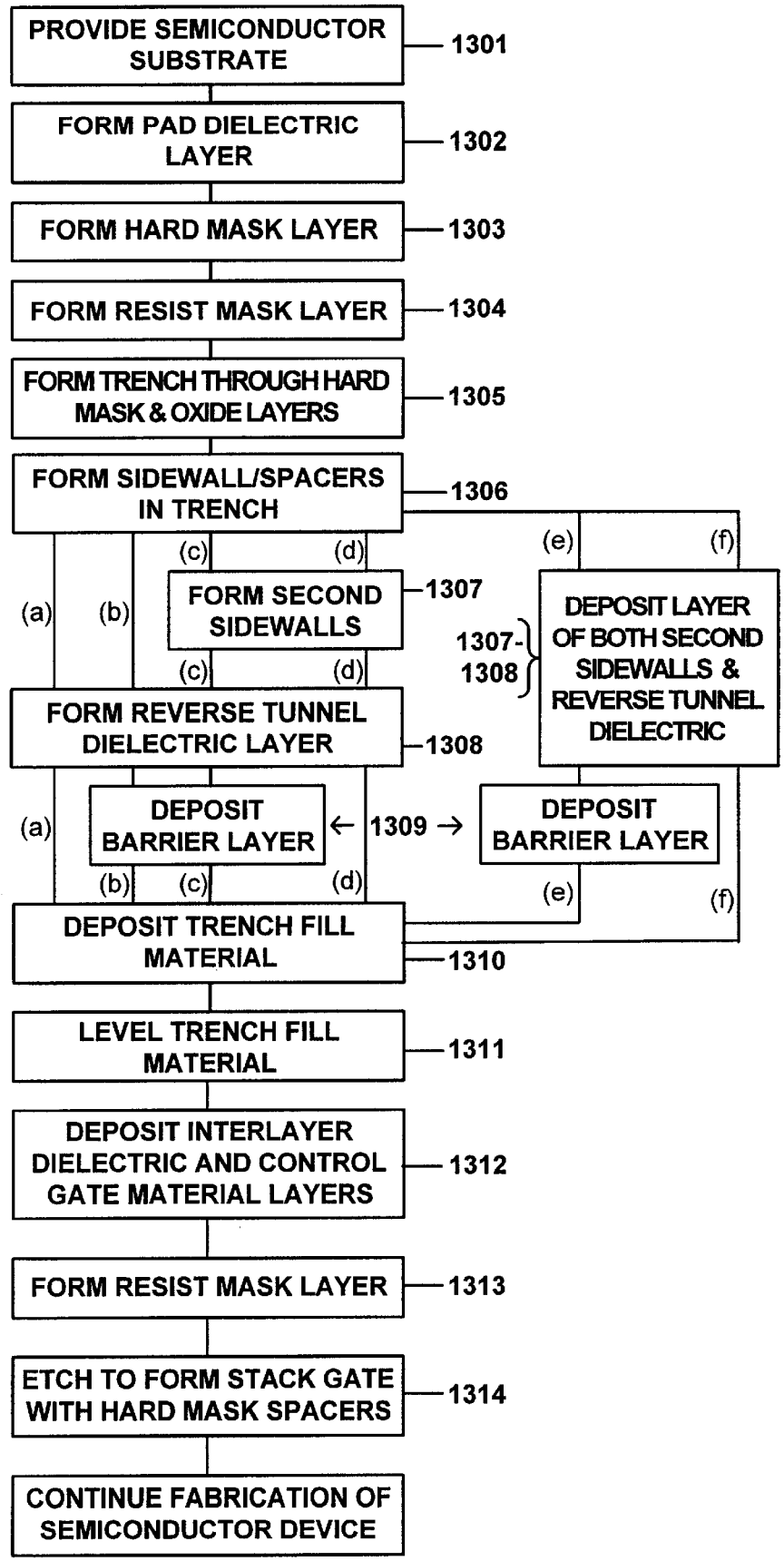
FIG. 13 is a schematic flow diagram showing steps of a process in accordance with one embodiment of the present invention.

A description of a method of fabricating a floating gate flash memory device in accordance with the present invention follows with reference to FIGS. 3–12, with steps of the process outlined in schematic flow chart form in FIG. 13. The following description of the process refers to FIGS. 3–12 sequentially and with reference to the steps shown in FIG. 13. In one embodiment, the present invention can be carried out in a cluster tool. Additional embodiments are described thereafter, with reference to FIGS. 14–19.

In the first step of the present invention, shown schematically in FIG. 13 as step 1301, a semiconductor substrate is provided. The semiconductor substrate 16 (see, e.g., FIG. 3) may be any appropriately selected semiconductor substrate known in the art. In one embodiment, the semiconductor substrate is a bulk silicon substrate. In one embodiment, the substrate comprises germanium. In one embodiment, the substrate is silicon-germanium. In one embodiment, the semiconductor substrate is a silicon-on-insulator (SOI) semiconductor substrate. In another embodiment, the semiconductor substrate is a germanium-on-insulator (GOI) substrate. In another embodiment, the semiconductor substrate is a p-doped silicon substrate. Other suitable semiconductor substrates include, for example, silicon-on-sapphire (SOS) semiconductor substrates and semiconductor substrates formed of other materials known in the art. The present invention is not limited to any particular type of semiconductor substrate.

Figure 3:
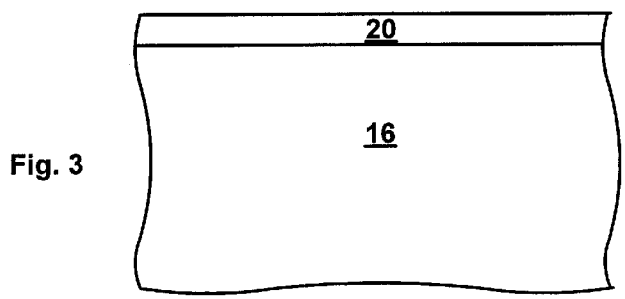
FIGS. 3–12 illustrate, in cross-section, structures during various process steps in the fabrication of a floating gate flash memory device in accordance with several embodiments of the invention.

Referring to FIG. 3, in the second step of the present invention, shown schematically in FIG. 13 as step 1302, a pad dielectric layer 20 is formed on an upper surface of the semiconductor substrate 16.

In one embodiment, the upper surface of the substrate 16 is processed to remove contaminants and native oxide, prior to formation of the pad dielectric layer 20. A suitable pre-clean procedure includes cleaning the surface with a dilute solution of hydrofluoric acid or any standard cleaning procedure used in the semiconductor industry.

The pad dielectric layer 20 may be formed by any process and may comprise any standard-K, high-K or composite dielectric material known in the art. In one embodiment, the pad dielectric layer 20 comprises silicon dioxide. In one embodiment, the pad dielectric layer 20 comprises both a high-K dielectric material and a standard-K dielectric material. In one embodiment, the pad dielectric layer 20 comprises a high-K dielectric material. In one embodiment, the pad dielectric layer 20 comprises a composite dielectric material, which comprises a mixture or composite of the elements of, or a reaction product of, two or more dielectric materials, at least one of which is a high-K dielectric material.

Any suitable method may be used for formation or deposition of the pad dielectric layer 20. For example, in one embodiment, the layer 20 may be grown by a thermal oxidation process. In another embodiment, the layer 20 is deposited by a suitable method, such as any known CVD method suitable for deposition of such a dielectric material. For example, the CVD method may be one such as APCVD, LPCVD, PECVD, RTCVD, ALCVD or MOCVD. The present invention is not limited to any particular method of forming the pad dielectric layer 20, or to any particular material therefor.

Regarding dielectric constants, or K values, silicon dioxide (sometimes simply referred to as "oxide") has a K value of approximately 4, while other dielectric materials may have higher K values. Silicon nitride ("nitride"), for example, has a K of about 6 to 9 (depending on formation conditions). Higher K values of, for example, 20 or more can be obtained with various transition metal oxides including hafnium oxide ($HfO_2$), zirconium oxide, ($ZrO_2$), tantalum oxide ($Ta_2O_5$), barium strontium titanate ("BST"), lead zirconate titanate ("PZT"), and others described more fully below. K values may range up to about 5000.

Using a high-K dielectric material for full or partial replacement of the silicon dioxide conventionally used for a dielectric layer, such as the pad dielectric layer 20, allows a low electrical thickness to be achieved even with a physically thick layer. For example, a high-K dielectric material gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness. Thus, the high-K dielectric material gate dielectric with a K of 40 having a given physical thickness has an equivalent oxide thickness which is approximately 1/10 the given physical thickness. For higher-K dielectric materials, thicker gate dielectric layers can be formed while maintaining equivalent oxide thickness values lower than are possible with very thin oxide layers. In this way, the reliability problems associated with very thin dielectric layers may be avoided while transistor performance is increased.

Figure 4:
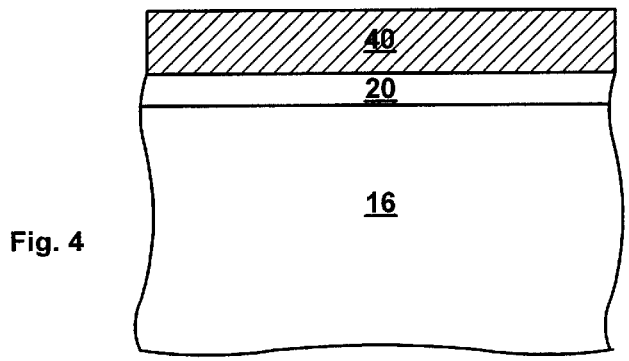

Referring to FIG. 4, in the third step of the present invention, shown schematically in FIG. 13 as step 1303, a hard mask layer 40 is deposited over the pad dielectric layer 20. The hard mask layer 40 may be formed by any appropriate method known in the art. For example, the hard mask layer 40 may be formed by a suitable CVD process such as APCVD, LPCVD, PECVD, RTCVD, ALCVD or MOCVD. The present invention is not limited to any particular method of forming the hard mask layer 40.

In one embodiment, the hard mask layer 40 is silicon nitride. In another embodiment, the hard mask layer 40 is silicon-rich silicon nitride. In other embodiments, the hard mask layer 40 may be another suitable nitride, such as silicon oxynitride. In one embodiment, the hard mask layer 40 comprises silicon nitride ($Si_3N_4$), silicon oxynitride (which may be expressed as $Si_wO_xN_y$, or as $Si_wO_xN_yH_z$, in which w, x, y and z, when H is present, vary depending on formation conditions), or mixtures thereof. Silicon oxynitride has also been expressed by the formula $(Si_3N_4)_x$ $(SiO_2)_{1-x}$. Silicon oxynitride may be referred to simply as SiON, with the recognition that the empirical formula may vary.

In one embodiment, the hard mask layer 40 is formed by means of a rapid-themal-chemical-vapor-deposition (RTCVD) process. In one embodiment, the RTCVD process is carried out at a temperature of about 700° C. to about 800° C. Silicon nitride may be formed, for example, by reacting a suitable nitrogen-containing gas, e.g., ammonia ($NH_3$) with a suitable silicon-containing gas, e.g., dichlorosilane ($SiCl_2H_2$) or silane ($SiH_4$).

Figure 5:
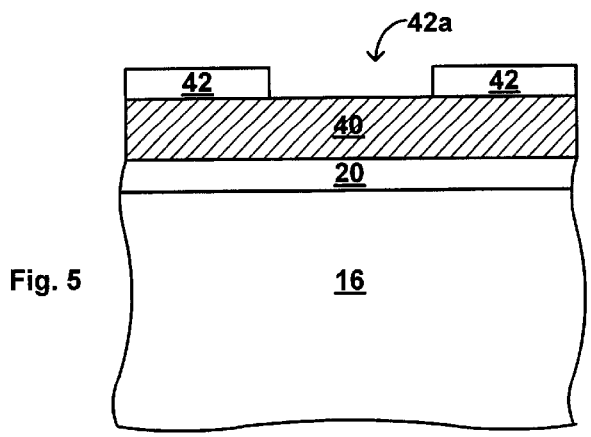

Referring to FIG. 5, in the fourth step of the present invention, shown schematically in FIG. 13 as step 1304, a resist mask layer 42 is formed and patterned on the hard mask layer 40 to form exposed areas 42a, one of which is shown in FIG. 5. The exposed areas 42a define locations where trenches will be etched in subsequent trench formation steps. In one embodiment, the exposed areas 42a define locations for formation of trenches in which the stack gates 30 will be formed. In another embodiment, the exposed areas 42a further define locations for formation of trenches in which shallow trench isolation (STI) structures will be formed. In yet another embodiment, the exposed areas 42a define locations for formation of trenches in which both the stack gates 30 and the STI structures will be formed. As described below, the STI structures may be used, e.g., to separate adjacent rows of stack gates 30 in the semiconductor device. Formation and patterning of the resist mask layer 42 to form the exposed areas 42a may be carried out by any method known in the art, and may include a plurality of steps and materials, as appropriate.

Figure 6:
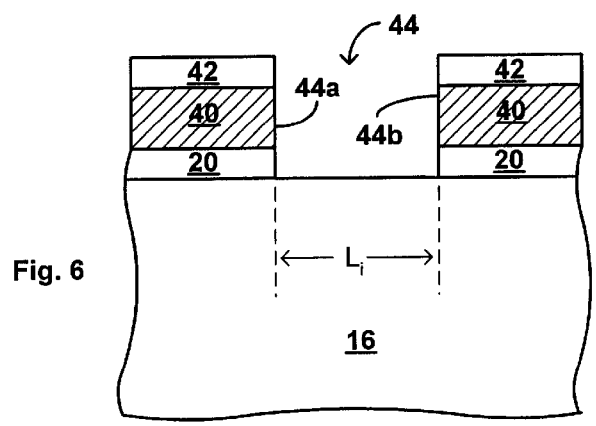

Referring next to FIG. 6, in the fifth step of the present invention, shown in FIG. 13 as step 1305, an initial trench 44 is formed through the hard mask 40 and pad dielectric 20 layers. In some embodiment, described in more detail below with respect to the processes of FIGS. 14, 15, 17 and 18, the initial trench is etched only through the hard mask 40, stopping at the pad oxide layer 20. The initial trench 44 may be formed by any suitable process known in the art. In one embodiment, the etching is an anisotropic, directional etching, e.g., a reactive ion etching. In one embodiment, the etching is an anisotropic dry etch. Appropriate etching methods, including both etchants and etching apparatus, can be selected by those of skill in the art as appropriate. Depending on the particular etching method used, the initial trench 44 is formed typically to include vertical sidewalls 44a, 44b, such as shown in FIG. 6. In one embodiment, not shown, the initial trench may be formed to include non-vertical sidewalls, which would leave structures similar to the sidewall/spacer 36 shown in FIG. 6. However, since purposely forming such non-vertical sidewalls may include additional processing steps, it is generally not done. As shown in FIG. 6, the initial trench 44 has an initial lateral extent, $L_i$, defined by the opposite hard mask and dielectric layer sidewalls 44a, 44b formed in the hard mask layer 40 and in the dielectric layer 20 by the etching process, as shown in FIG. 6. In one embodiment, the etchant used to etch the trench 44 comprises a fluoride compound such as $CF_4$, $CHF_3$, $CH_2F_2$ or $NF_3$. The etchant may further comprise Ar or He. In one embodiment, an Applied Materials 5000 reactor may be used to perform this etch.

Figures 7A, 7B:
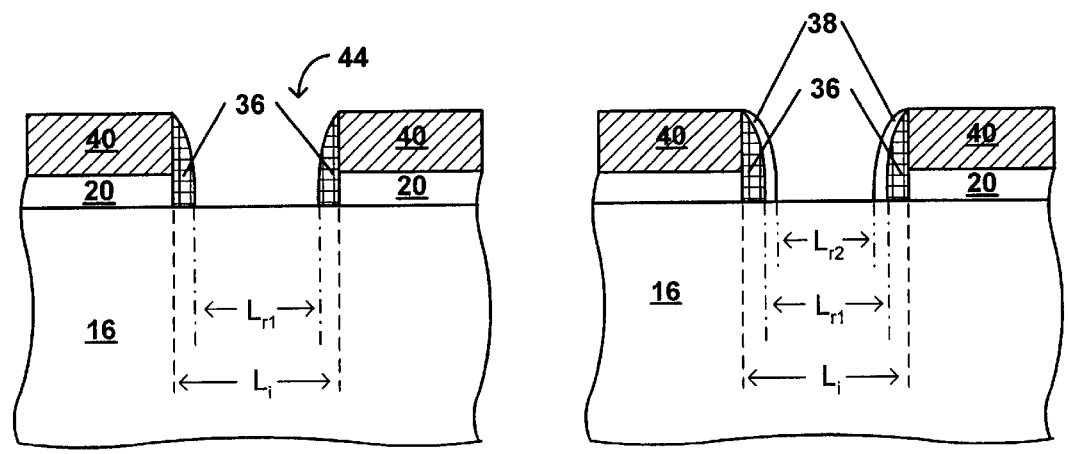

Following formation of the trench 44, in the sixth step of one embodiment of the process of the present invention, shown in FIG. 13 as step 1306, the sidewall/spacers 36 are formed in the trench 44, resulting in a structure such as that shown in FIG. 7A. As illustrated by FIG. 7A, by formation of the sidewalls 36, the initial lateral extent $L_i$ of the initial trench 44 has been reduced to form a reduced trench 44 having a first reduced lateral extent $L_{r1}$. Thus, the size of the initially formed trench has been reduced by formation of the sidewalls 36.

The sidewalls 36 may be formed by any suitable method known in the art for formation of a material on the inner walls of a trench. For example, in one embodiment, the sidewalls 36 may be formed by oxidation of the sidewalls 44a, 44b by application of suitable oxidizing conditions. In this embodiment, if the hard mask layer is, for example, silicon nitride, then the sidewalls 36 may comprise silicon dioxide or silicon oxynitride. In another embodiment, the sidewalls 36 are formed by deposition and etchback of a suitable material. Suitable materials for deposition and etchback include silicon dioxide, silicon oxynitride, low-K dielectric materials such as, for example, fluorinated silicate glass, a porous silicon oxide layer, or fluorine-doped $SiO_2$, or, in other embodiments, any of the low-K dielectric materials disclosed below with respect to the STI structure. Other suitable low-K dielectric materials known in the art may be used. By use of the term "low k" herein, with respect to the dielectric constant of the dielectric material, is intended to define a dielectric constant of a dielectric material of about 3.5 or less. In one embodiment, the dielectric constant of the "low k" material is about 3.0 or less.

In one embodiment, the sidewall/spacers 36 are modified by, for example, an ion implantation, in order to adjust or change the properties of the material of which the sidewall/spacers 36 are formed. Such treatment may be used, for example, to modify the electrical properties, or to modify other characteristics, such as the diffusibility of atoms or ions or other materials therethrough, of the sidewall/spacers 36. One such example is fluorine implantation to form the above-mentioned doped $SiO_2$. Suitable ions for implantation may be selected based upon the properties desired to be added to or modified in the materials of which the sidewall/spacers 36 are formed.

Alternative Routes to Reverse Tunnel Dielectric and Floating Gate Trench Fill In accordance with the present invention, following the step 1306, the next major step shared by all embodiments is step 1308, forming a reverse tunnel dielectric layer 28, as shown in FIG. 13. Following step 1308, the next major step shared by all embodiments in step 1310, depositing floating gate material to fill the trench 44, as shown in FIG. 13. However, as also shown in FIG. 13, there are at least six alternate routes from the sidewall/spacer forming step 1306 to the tunnel dielectric forming step 1308 to the metal depositing step 1310, including none, one or both of two optional, alternate steps 1307 and 1309, and combining steps 1307 and 1308, with or without step 1309. The six alternate routes, (a), (b), (c), (d), (e) and (f) are shown schematically in FIG. 13, with the optional, alternate included steps (i.e., steps 1307, 1309 and 1307+1308) indicated along the appropriate route identified by their intersection with the lines (a), (b), (c), (d), (e) and (f). While those of skill in the art will understand the various combinations of steps, and the structures obtained therefrom, for clarity each of these alternative routes is briefly described in the following disclosure. The six routes described below are not intended to be limiting, but are intended to provide examples of how the various steps may be combined by those of skill in the art. Alternative processes are described below with reference to FIGS. 14–19.

In general, in the following embodiments, the initial lateral extent, $L_i$, of the initially formed trench 44 is reduced to define a reduced trench 44 having a reduced lateral extent $L_{rx}$, in which x is at least one. Thus, the initial lateral extent of the trench may be reduced one, two, three or more times. In some embodiments, the initial lateral extent, $L_i$, of the initial trench 44 is reduced two times, in other embodiments, three times, and in yet other embodiments, four or more times. In most typical embodiments, x=1, 2 or 3.

In the embodiment designated as alternative route (a), a structure such as that shown in FIG. 7 proceeds directly from step 1306 to step 1308 and thence directly to step 1310, without intervening steps 1307 and 1309. In this embodiment, the sidewall/spacers 36 in FIG. 7 define the reduced lateral extent $L_{r1}$ of the trench 44, which was reduced from the initial lateral extent $L_i$ of the trench 44 shown in FIG. 6. In this embodiment, the step 1306, forming the sidewall/spacers 36, is the only step of reducing the lateral extent of the trench. In this embodiment, the step 1306 is followed by step 1308, formation of the reverse tunnel dielectric layer 28, to form a structure such as that shown in FIG. 8A. Thus, in this embodiment, the lateral extent of the initial trench 44 is reduced one times, and x=1. Methods and materials for use in forming the reverse tunnel dielectric layer 28 are described in more detail below.

Figure 8A:
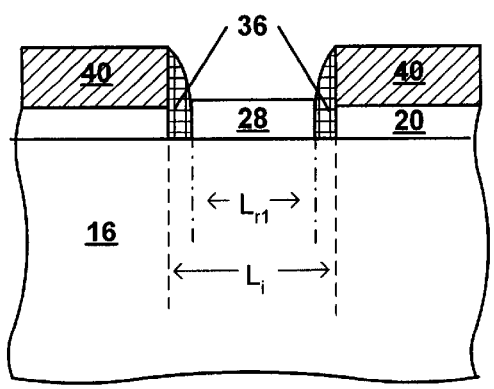
Figure 8B:
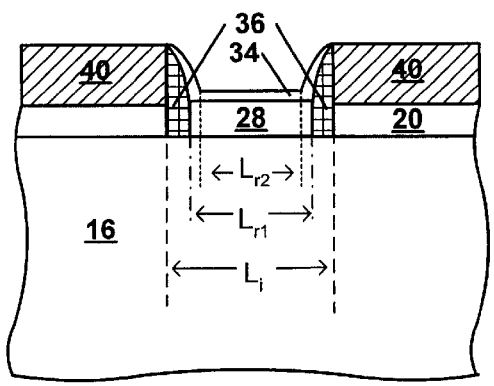

In the embodiment designated as alternative route (b), in a structure such as that shown in FIG. 7A, the step 1308 is carried out first and is followed by a step of depositing a barrier layer 34, indicated as step 1309 of FIG. 13, to form a structure such as that shown in FIG. 8B. Formation of the reverse tunnel dielectric layer 28 is similar to the corresponding step in the other embodiments, and is described in more detail below. Similarly, deposition of the barrier layer 34 is described in more detail below. In this embodiment, the barrier layer 34 forms a layer which reduces the lateral extent of the trench 33 from the first reduced lateral extent $L_{r1}$ to a second reduced lateral extent $L_{r2}$, as well as forming a barrier to metal migration. In this embodiment, the barrier layer 34 is analogous to the second sidewall 38 in reducing the lateral extent of the trench 44. In this embodiment, as shown in FIG. 8B, the initial lateral extent $L_i$, has been reduced first to $L_{r1}$ by formation of the sidewalls 36, and thence to $L_{r2}$ by formation of the barrier layer 34. That is, in this embodiment, the lateral extent of the initial trench 44 is reduced two times, and x=2.

Figure 8C:
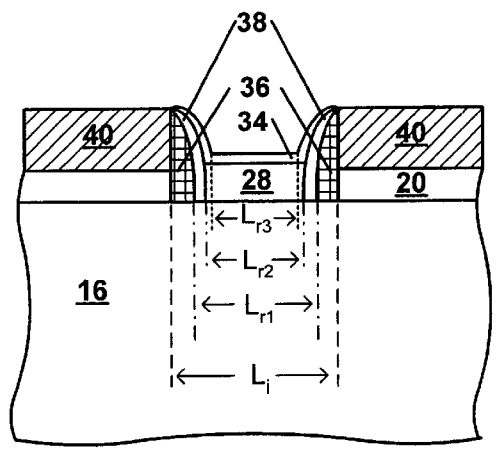
Figure 8D:
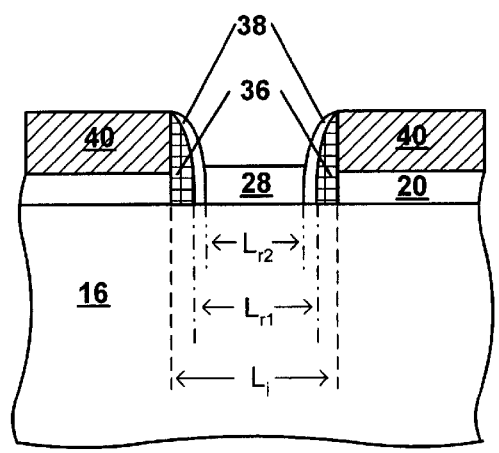

In the embodiment designated as alternative route (c), following step 1306, in a structure such as that shown in FIG. 7A, step 1307 is carried out to form the second sidewalls 38, as shown in FIG. 7B. Following step 1307, the reverse tunnel dielectric layer is formed by carrying out step 1308, and a structure such as that shown in FIG. 8D is obtained. Thereafter, the barrier layer 34 is formed in step 1309, to form a structure such as that shown in FIG. 8C. In this embodiment, the initial lateral extent $L_i$ of the trench 44 shown in FIG. 6 is reduced to the first reduced lateral extent $L_{r1}$ shown in FIG. 7A, and thence is further reduced to the second reduced lateral extent $L_{r2}$ shown in FIG. 7B. Thereafter, when the barrier layer 34 is formed in step 1309, the second lateral extent $L_{r2}$ is reduced to a third reduced lateral extent $L_{r3}$, as shown in FIG. 8C. That is, in this embodiment, the lateral extent of the initial trench 44 is reduced three times, and x=3.

In the embodiment designated as alternative route (d), following step 1306, in a structure such as that shown in FIG. 7A, step 1307 is carried out to form the second sidewalls 38, as shown in FIG. 7B. Following step 1307, the reverse tunnel dielectric layer is formed by carrying out step 1308, and a structure such as that shown in FIG. 8D is obtained. Thereafter in this embodiment, no barrier layer is formed, and the structure shown in FIG. 8D proceeds directly to step 1310. Thus, alternative (d) is essentially the same as the first part of the alternative route (c), but no barrier layer is formed. This embodiment would be selected, for example, when the metal used in the metal floating gate does not pose a threat of migration into the reverse tunnel dielectric layer 28, or when the material of the reverse tunnel dielectric layer 28 is not susceptible to poisoning by the metal of the metal floating gate, should the metal migrate into the layer 28. In this embodiment, the initial lateral extent $L_i$ of the trench 44 shown in FIG. 6 is reduced to the first reduced lateral extent $L_{r1}$ shown in FIG. 7A, and thence to the second reduced lateral extent $L_{r2}$ shown in FIG. 7B. That is, in this embodiment, the lateral extent of the initial trench 44 is reduced two times, and x=2.

Figure 8E:
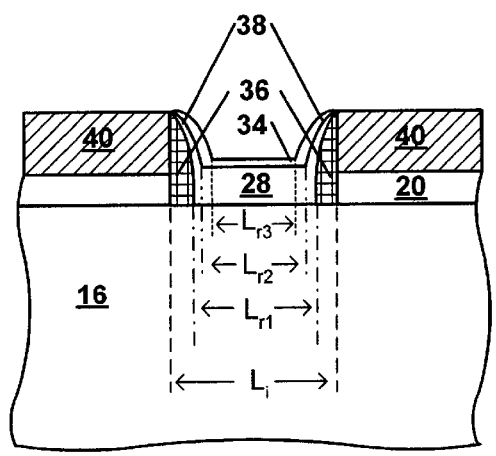
Figure 8F:
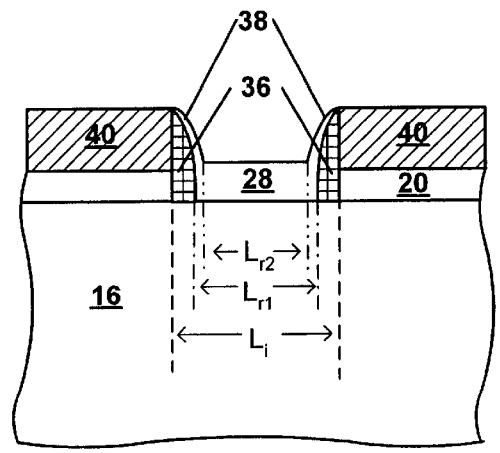

In the embodiment designated as alternative route (e), the step 1307, forming a second sidewall 38 in the trench 44, is combined with, or is simultaneous with, the subsequent step 1308, forming the reverse tunnel dielectric layer 28 as shown in FIG. 13 as combined step 1307–1308. In this embodiment, the combined step 1307–1308 is followed by the step 1309, depositing a barrier layer 34, to form a structure such as that shown in FIG. 8E. In this embodiment, the material of which the second sidewall 38 is formed is the same material as the material of which the reverse tunnel dielectric layer 28 is formed. In this embodiment, in a single deposition step, the second sidewall 38 and the reverse tunnel dielectric layer 28 are deposited, and subsequent treatment steps, such as etching to remove excess material, is carried out so as to retain the deposited material which forms the second sidewalls 38. The depth of the trench 44 is also reduced by formation of the reverse tunnel oxide layer 28. In this embodiment, the initial lateral extent $L_i$ of the trench 44 is reduced first to the first reduced lateral extent $L_{r1}$ by formation of the sidewalls 36, and then to the second reduced lateral extent $L_{r2}$ by formation of the second sidewalls 38, as shown in FIG. 8F. In this embodiment, the lateral extent of the trench is further reduced from the second reduced lateral extent $L_{r2}$ to a third reduced lateral extent $L_{r3}$, by deposition of the barrier layer 34, as shown in FIG. 8E. Thus, in this embodiment, the lateral extent of the initial trench 44 is reduced three times, and x=3.

In the embodiment designated as alternative route (f), the step 1307, forming a second sidewall 38 in the trench 44, is combined with, or is simultaneous with, the subsequent step 1308, forming the reverse tunnel dielectric layer 28, to form a structure such as that shown in FIG. 8F. In this embodiment, the material of which the second sidewall 38 is formed is the same material as the material of which the reverse tunnel dielectric layer 28 is formed, as in alternative route (e). In this embodiment, in a single deposition step, the second sidewall 38 and the reverse tunnel dielectric layer 28 are deposited, and subsequent treatment steps, such as etching to remove excess material, is carried out so as to retain the deposited material which forms the second sidewalls 38. The depth of the trench 44 is also reduced by formation of the reverse tunnel oxide layer 28. However, in this embodiment, no barrier layer is formed, in contrast to alternative route (e). The barrier layer may be omitted for the same reasons indicated above in the alternative route (d). In this embodiment, the initial lateral extent $L_i$ of the trench 44 is reduced first to the first reduced lateral extent $L_{r1}$ by formation of the sidewalls 36, and then to the reduced lateral extent $L_{r2}$ by formation of the second sidewalls 38, as shown in FIG. 8F. Thus, in this embodiment, the lateral extent of the initial trench 44 is reduced two times, and x=2.

The foregoing is a brief summary of the six alternative routes, each resulting in a different structure, as shown in FIGS. 8A–8F. As will be recognized by those of ordinary skill in the art, the steps outlined here are the primary steps of the process, and would be supported by a number of additional secondary or support steps, which would be conventionally included in such a process.

At an appropriate point in the process, as determined by the particular embodiment and alternative route or routes selected, such as the alternative embodiments described above, the step 1308, formation of the reverse tunnel dielectric layer 28, is carried out.

The reverse tunnel dielectric layer 28 may be formed from any appropriate material known in the art for use as a tunnel dielectric material. A particular feature of the present invention is that formation of the reverse tunnel dielectric material layer 28 at this point in the process allows selection of the dielectric material without regard to the material used for the pad dielectric layer 20. The "reverse" tunnel dielectric is so named due to its formation at this point in the process, rather than at a much earlier point, as in a conventional floating gate flash memory device (i.e., the "reverse" tunnel dielectric is formed out of conventional sequence). Thus, a material may be used for the reverse tunnel dielectric layer 28 which for one reason or another might not be suitable for use as the pad dielectric layer 20. Thus, in one embodiment, the reverse tunnel dielectric material is different from the pad dielectric material 20. In one embodiment, the reverse tunnel dielectric material is a standard-K dielectric material, in another embodiment, it is a high-K dielectric material, and in another embodiment it is a composite dielectric material, as defined above.

In another embodiment, the reverse tunnel dielectric material comprises more than one layer of two or more such dielectric materials. In one embodiment, the reverse tunnel dielectric material comprises two layers, and in another embodiment, three layers, of two or more different dielectric materials. In one embodiment, a relatively thin barrier dielectric layer is formed on the silicon substrate 16, in order to provide a barrier between the substrate 16 and a second layer including a high-K dielectric material.

The reverse tunnel dielectric layer 28 may be formed by any appropriate method known in the art for deposition or formation of dielectric layers. Thus, in one embodiment, the reverse tunnel dielectric layer is silicon dioxide, simply grown on the surface of the substrate 16 by a thermal oxidation. In other embodiments, the material of the reverse tunnel dielectric layer 28 is formed by an appropriate method, such as a CVD method or a spin-on method, as known in the art. In an embodiment in which the reverse tunnel dielectric layer comprises a high-K dielectric material, it may be formed by a suitable process such as described above with respect to high-K dielectric materials. In one embodiment, the reverse tunnel dielectric layer 28 may comprise any of the high-K materials disclosed above with respect to the pad dielectric layer 20.

The ninth step, step 1309 shown in FIG. 13, is an optional step in the process of the present invention, as described above, and may be carried out following formation of the reverse tunnel dielectric layer 28 in appropriate embodiments. In the step 1309, a barrier layer 34 is deposited over the reverse tunnel dielectric layer 28, as shown for example in FIGS. 8B, 8C and 8E. The barrier layer 34 forms a barrier to migration of the metal of the metal floating gate 32. Thus, the primary purpose of the barrier layer 34 is to protect the reverse tunnel dielectric layer 28, and other structures in both the stack gate 30 and the metal floating gate flash memory device 100, from metal which may otherwise migrate or diffuse from the metal floating gate 32 into these structures. In some embodiments, metal migrating from the metal floating gate 32 into the reverse tunnel dielectric layer 28 may adversely impact the intended electrical function of the layer 28. In some embodiments, metal migrating from the metal floating gate 32 into other adjacent or nearby elements of the metal floating gate flash memory device 100 may adversely impact the function of such elements. The barrier layer 34 is intended to prevent such metal migration.

In one embodiment, when the metal floating gate 32 comprises Ru, the barrier layer 34 is RuTiN. In other embodiments, the barrier layer 34 may include at least one layer containing at least one of RuTiN, TiN, TaN, TaSiN, TiW, WN, or a mixture or composite thereof. Thus, in one embodiment, the barrier layer 34 includes more than one layer, and each such layer may contain at least one of the foregoing materials or a mixture or composite thereof. As used herein, a mixture comprises a physical mixture of the specified materials, wherein the separate materials have not reacted together, while a composite comprises a mixture of the specified materials in which at least some of the materials have chemically reacted with one another.

In an embodiment in which the floating gate material is polysilicon or polysilicon-germanium, or other conventional material, the barrier layer may be omitted. As noted elsewhere herein, the barrier layer may be omitted when the metal poses either no threat of migration or no threat if it does migrate.

The barrier layer 34 may be deposited by any appropriate method known in the art for deposition of such materials. The deposition may be a conformal deposition, followed by an appropriate etching process to remove the barrier material from portions of the device where it is not wanted or needed, to form a structure such as that shown in FIGS. 8B, 8C and 8E. The etching to remove the unwanted portions of the barrier layer 34 may be, for example, an anisotropic etch and/or a CMP process, as appropriate.

In one embodiment, not shown, the anisotropic etching results in a structure in which the barrier layer 34 remains only on the upper surface of the reverse tunnel dielectric layer 28. In this embodiment, the barrier material is removed both from the surface of the device as a whole, i.e., the portion of the barrier material deposited on the upper surface of the bard mask layer 40, and from the sidewall/spacers 36 or the second sidewalls 38, depending on whether the sidewall/spacers 36 or the second sidewalls 38 (or both) are present in the given embodiment. This embodiment may be used, for example, in a device in which the metal floating gate 32 comprises one or more of (a) metals which do not migrate through the sidewall/spacers 36 or the second sidewalls 38, or (b) metals which pose no threat to proper electrical functioning if the metals do migrate into the adjacent structures (other than the reverse tunnel barrier layer 28), or (c) in which the sidewall/spacers 36 and/or the second sidewalls 38 comprise materials which constitute a barrier to migration of the particular metal.

In the tenth step according to one embodiment of the present invention, step 1310, shown in FIG. 13, a metal layer 32 is deposited on the device to fill the remaining trench 44. In other embodiments, in step 1310, a material such as polysilicon or polysilicon-germanium is deposited on the device to fill the remaining trench 44. The material deposited, whether metal, polysilicon or polysilicon-germanium, or other material, thereby forms the structure that will become the floating gate 32, as shown in FIGS. 9A–9F. FIGS. 9A–9F correspond, respectively, to FIGS. 8A–8F. In each embodiment shown in FIGS. 9A–9F, the respective FIGS. 8A–8F structure has had the floating gate material layer 32 deposited thereon to form the structure shown in each respective figure. To this end, as shown in each of FIGS. 9A–9F, the surface of the device is covered by a layer of an appropriate material 32, which subsequently will form the floating gate 32.

The floating gate material layer 32 may be deposited by any appropriate method, including PVD, CVD, sputtering, electroless deposition, immersion coating, and electrodeposition. The CVD methods may include any of the methods disclosed herein for deposition of materials, such as APCVD, LPCVD, PECVD, RTCVD, ALCVD and MOCVD.

Suitable metals which may be used for the metal floating gate in appropriate embodiments of the present invention include one or more of $RuO_2$, Ru, Rh, Pd, Os, Ir and Pt, mixtures and alloys thereof and alloys comprising one or more of Ru, Rh, Pd, Os, Ir and Pt. As noted above, suitable materials which may be used for the floating gate include polysilicon and polysilicon-germanium.

In one embodiment, the metal floating gate 32, reverse tunnel dielectric layer 28 and the barrier layer 34, if present, achieve a workfunction in the range from about 4 to about 5.5 eV, and in another embodiment, a workfunction in the range from about 4.2 to about 5.2 eV. Such workfunction provides better programmability. In addition, these metals have thermal stability at temperatures of 1000° C. and higher.

Figure 9A:
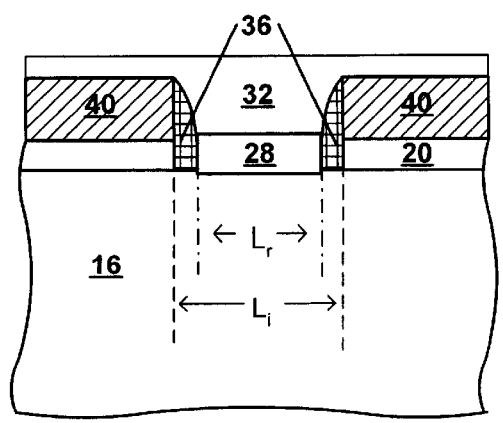
Figure 9B:
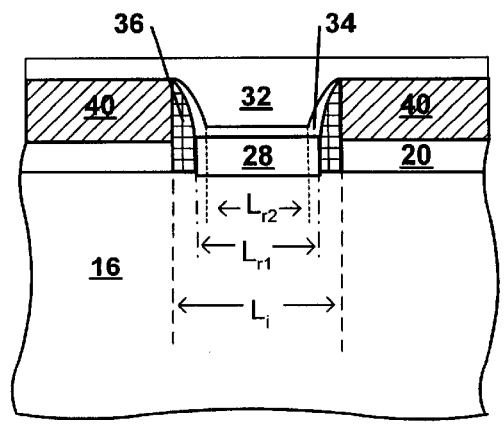
Figure 9C:
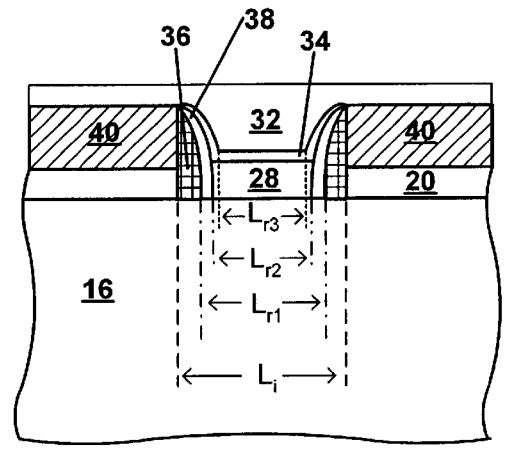
Figure 9D:
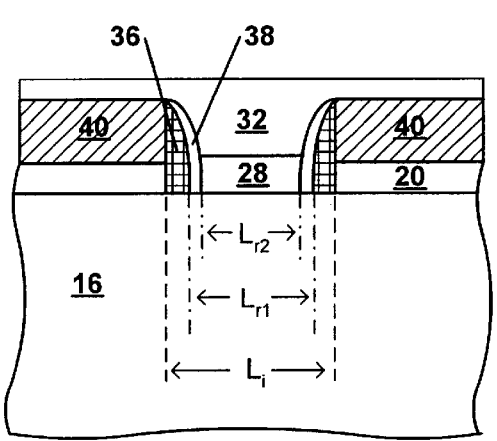
Figure 9E:
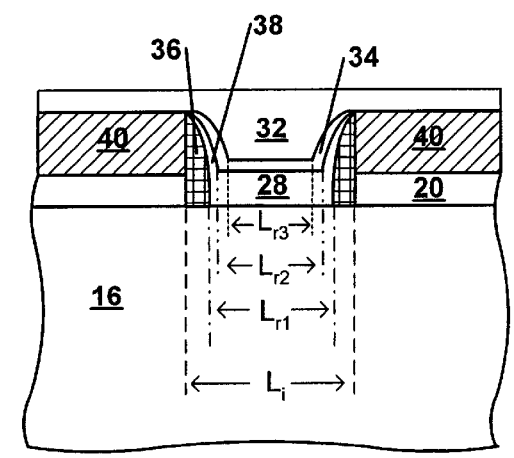
Figure 9F:
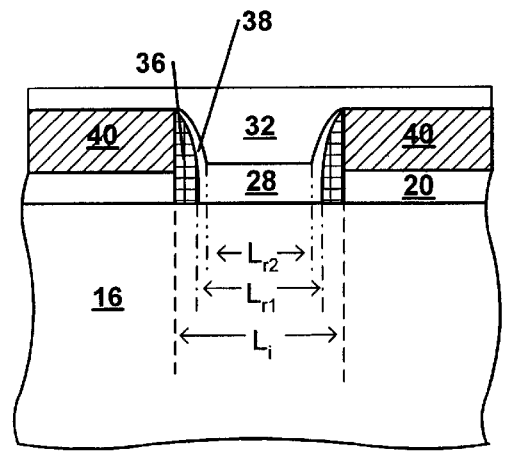

For the sake of brevity, in the following description of the process steps after deposition of the floating gate material layer 32, a single embodiment has been selected for exemplifying the remaining steps of the process. For this reason, the embodiment of FIGS. 8C and 9C is used and shown in FIGS. 10–12, and is the embodiment shown in FIG. 2. As will be understood by those of ordinary skill in the art, each of the embodiments of FIGS. 8A–8F and FIGS. 9A–9F, carried through the remaining steps described below, would result in the formation of a structure analogous to that shown in FIG. 2, differing from the actual FIG. 2 in the same way FIGS. 9A, 9B and 9D–9F differ from FIG. 9C.

Figure 10:
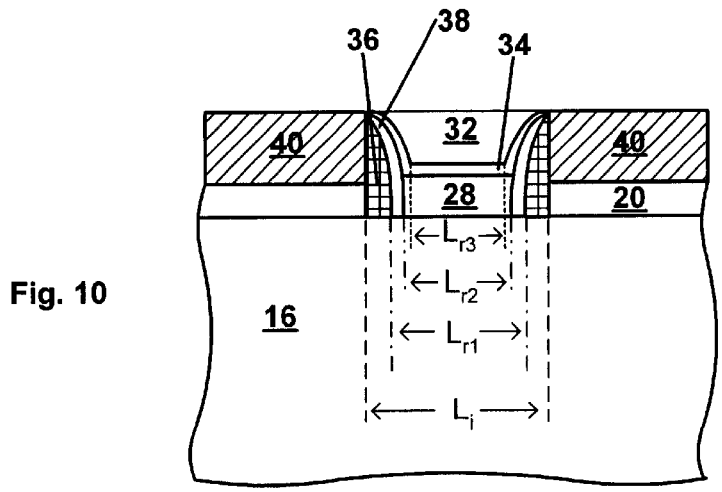

In the eleventh step according to the present invention, step 1311, shown in FIG. 13, the floating gate material layer 32 is subjected to an appropriate procedure to remove unwanted portions of the floating gate material layer 32, while leaving the floating gate 32 filling the trench 44, as shown in FIG. 10. In one embodiment, this procedure is chemical mechanical polishing (CMP). The CMP may be carried out by any appropriate manner known in the art. Other methods may be appropriately selected by those of skill in the art.

In the twelfth step according to the present invention, step 1312, shown in FIG. 13, an interlayer dielectric layer 24 and a control gate layer 26 are deposited on the device, as shown in FIG. 11. These layers may be formed of any materials known in the art for such structures. The step 1312 comprises a plurality of well known steps, which are not set forth in detail for brevity.

For example, the interlayer dielectric layer 24 may comprise any of the materials described above for the reverse tunnel dielectric layer 28 and for the pad dielectric layer 20. Thus, the interlayer dielectric may comprise one or more layers of a standard-K dielectric material, a high-K dielectric material or a composite dielectric material. In one embodiment, the interlayer dielectric layer 24 comprises a multiple-layer interlayer dielectric 24. An example of a three-layer interlayer dielectric structure is shown in FIG. 11, in which the layer 24 comprises a top layer 24a, a middle layer 24b, and a bottom layer 24c. In one embodiment, the interlayer dielectric layer 24 is an ONO structure, or a modified ONO structure. In an ONO structure, the top and bottom layers 24a and 24c comprise an oxide, such as silicon dioxide, and the middle layer 24b comprises a nitride, such as silicon nitride. In a modified ONO structure, one or both of the oxide layers may comprise or be replaced by a high-K dielectric material. In another embodiment of a modified ONO structure, the middle layer may comprise or be replaced by a high-K dielectric material. The interlayer dielectric 24 may be formed by any known process. For example, where the interlayer dielectric 24 is ONO, it is suitably formed by growing a layer of oxide, depositing a layer of nitrate, followed by growing another layer of oxide. Where either oxide layer is replaced by a material comprising a high-K dielectric material, at least the high-K dielectric material portion of the layer must be deposited.

In other embodiments, the interlayer dielectric layer 24 may comprise a plurality of layers, in the range from 2 to about 5 layers. These layers may comprise any of the above-disclosed materials, in any order.

The control gate layer 26 may comprise any material known for use as a control gate in a floating gate flash memory device. Those skilled in the art will recognize that various gate-forming materials can be used to fabricate the control gate electrode 28. For example, the control gate electrode 28 may be formed with polycrystalline silicon, polysilicon-germanium, amorphous silicon, a refractory metal silicide, a metal, and the like.

Following formation of the interlayer dielectric layer 24 and the control gate layer 26, an etching process is carried out to form and define the stack gate structure 30 such as that shown in FIG. 2, as indicated in FIG. 13 as steps 1313 and 1314.

Thus, in the thirteenth step of the present invention, shown as step 1313 in FIG. 13, a stack gate resist mask layer 46 is formed and patterned over the control gate layer 26, as shown in FIG. 11. In one embodiment, the stack gate resist mask layer 46 is formed, patterned and developed at the smallest possible dimension. In another embodiment, the stack gate resist mask layer 46 is first formed, patterned and developed at a small or the smallest possible photolithographic dimension, and thereafter the stack gate resist mask layer 46 may be further reduced in size by an etching procedure known as a resist trim etch, prior to the etching process used to etch the underlying layers to define the stack gate 30. In this manner, the overall dimensions of the stack gate 30 may be reduced as much as possible.

In the fourteenth step of the present invention, shown as step 1314 in FIG. 13, a structure such as that shown in FIG. 11 is etched to form a stack gate 30, as shown in FIG. 12. The stack gate shown in FIG. 12 includes the stack gate resist mask layer 46, which will be subsequently removed.

As a result of the foregoing procedure, many steps of which have been omitted since these steps are well known to persons of ordinary skill in the art, the floating gate flash memory device 100 shown in FIG. 2 is obtained. One of the features of the present invention is the hard mask sidewalls 40 in the stack gate 30. These sidewalls 40 provide protection and dielectric insulation to the stack gate 30.

Alternative Embodiments of Floating Gate Flash Memory Devices and Methods

In the following description of alternate embodiments of the present invention, the steps are identified by the same numbers as in the foregoing description. The various embodiments described below omit various of the above-described steps, or portions thereof, and result in the formation of floating gate flash memory devices similar to, but differing in various aspects from, the embodiments described above.

Figure 14:
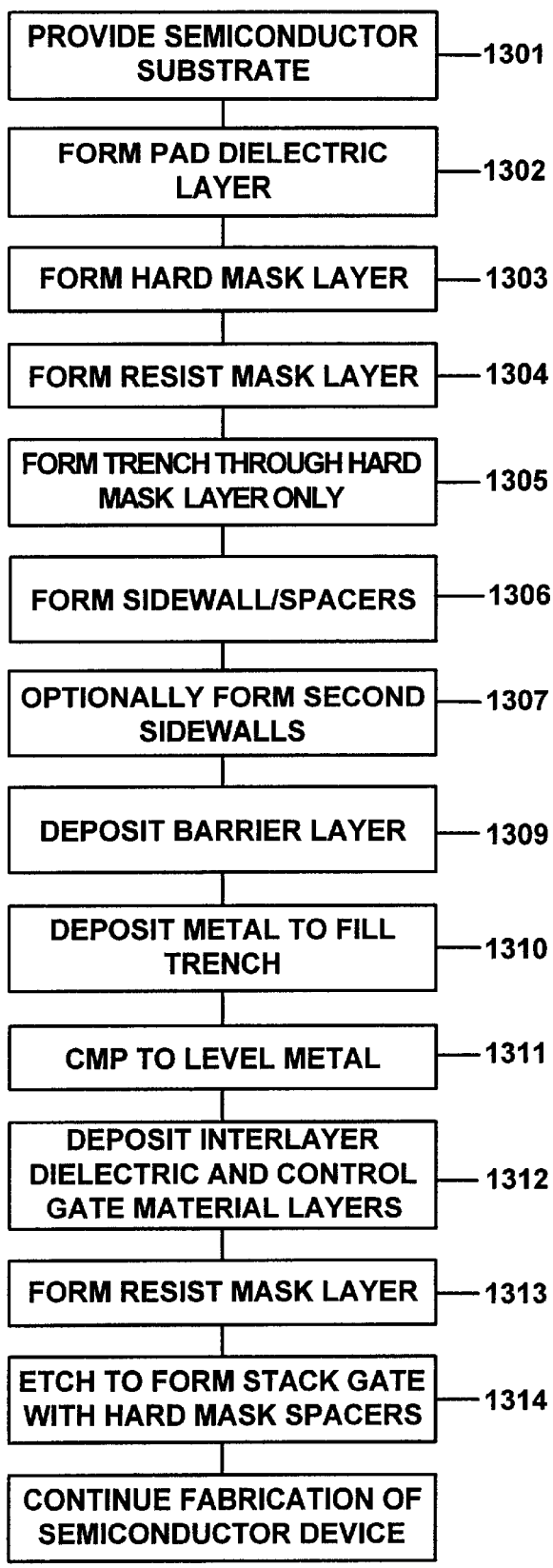
FIG. 14 is a schematic flow diagram showing steps of the process in accordance with another embodiment of the present invention.

FIG. 14 is a schematic flow diagram showing steps of the process in accordance with another embodiment of the present invention. In the embodiment shown in FIG. 14, the step 1305 etches through only the hard mask layer 40, but not through the pad oxide layer 20, and the reverse tunnel dielectric layer is not formed, so step 1308 is omitted. In this embodiment, the initial trench 44, formed through only the hard mask layer 40, has an initial lateral extent $L_i$, which optionally may be reduced by formation of sidewall/spacers 36 in a step 1306, and by formation of second sidewalls 38 in a step 1307. This embodiment includes formation of a barrier layer 34 in step 1309 and a metal floating gate material 32 in step 1310. As disclosed above, the barrier layer 34 may form sidewalls which further reduce the initial lateral extent $L_i$ of the trench 44. Thus, in this embodiment, the initial lateral extent of the trench may be reduced one, two or three times, so that x=1, 2 or 3.

Figure 17:
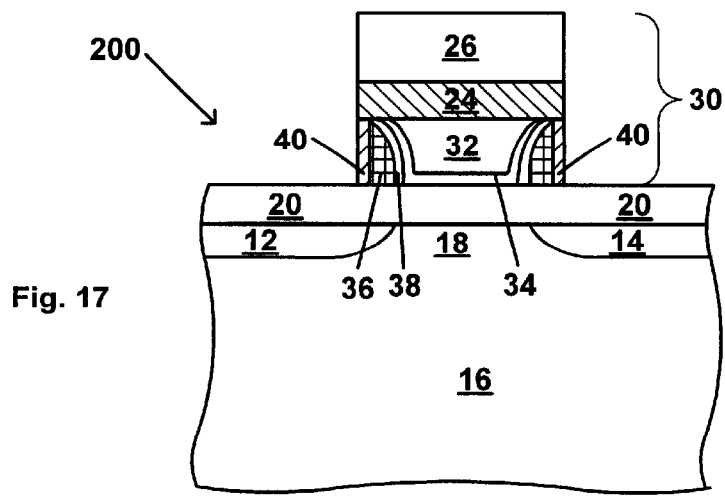
FIG. 17 illustrates, in cross-section, a floating gate flash memory device in accordance with another embodiment of the present invention, including a metal floating gate and barrier layer, sidewall/spacers and second sidewalls, but not a reverse tunnel dielectric layer, in accordance with an embodiment of the process shown in FIG. 14.

An exemplary metal floating gate flash memory cell 200 in accordance with the method of FIG. 14 is shown in FIG. 17. As shown in FIG. 17, the metal floating gate 32 is formed on the barrier layer 34, which is formed on the pad oxide layer 20. The cell 200 shown in FIG. 17 includes the sidewall/spacers 36, the second sidewalls 38, and the barrier layer 34 including sidewall extensions thereof. Thus, in the embodiment shown in FIG. 17, the initial lateral extent $L_i$ of the initial trench 44 has been reduced three times.

Figure 15:
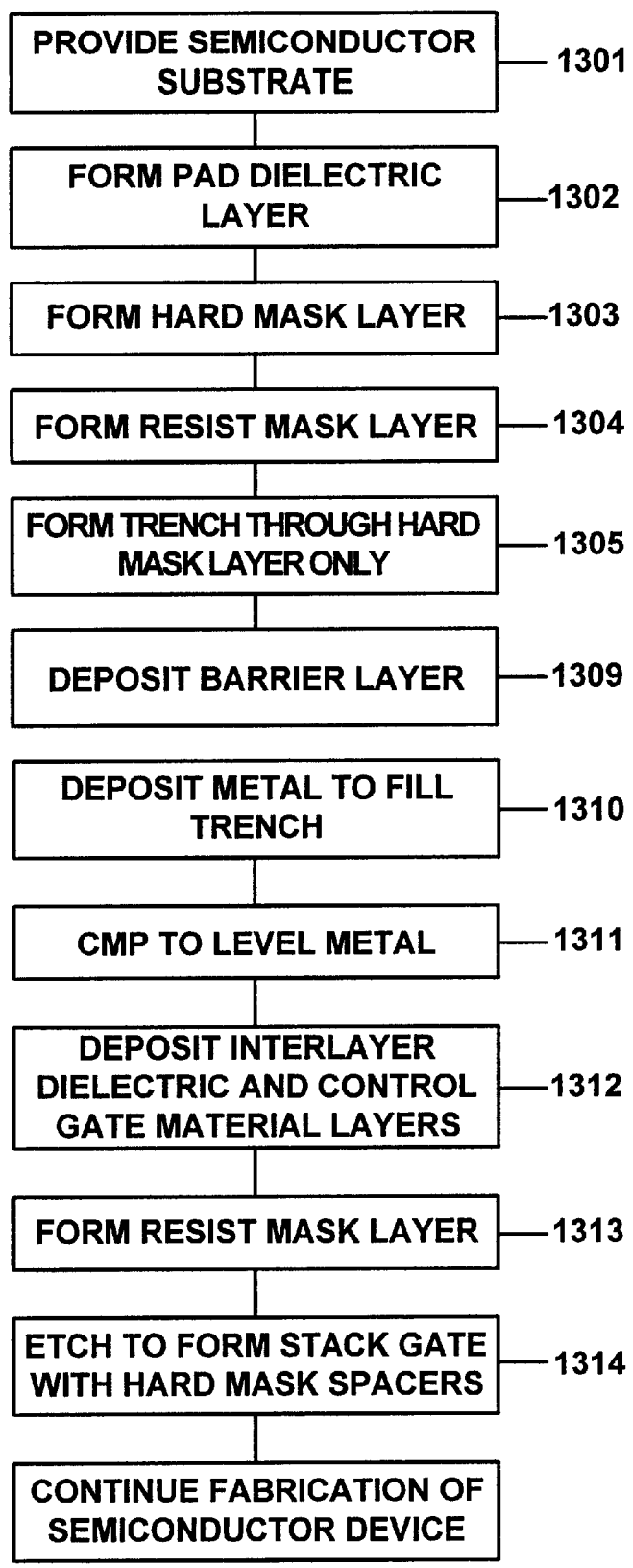
FIG. 15 is a schematic flow diagram showing steps of the process in accordance with still another embodiment of the present invention.

FIG. 15 is a schematic flow diagram showing steps of the process in accordance with still another embodiment of the present invention. In the embodiment shown in FIG. 15, the step 1305 etches through only the hard mask layer 40, but not through the pad oxide layer 20, and the reverse tunnel dielectric layer is not formed, so step 1308 is omitted. In this embodiment, the initial trench 44, formed through only the hard mask layer 40, has an initial lateral extent $L_i$, which is reduced only by formation of the barrier layer 34 in a step 1309. Thus, the embodiment shown in FIG. 15 omits steps 1306 and 1307, as well as step 1308. This embodiment includes formation of a barrier layer 34 in step 1309 and a metal floating gate material 32 in step 1310. As disclosed above, in this embodiment, the barrier layer 34 forms sidewalls which reduce the initial lateral extent $L_i$ of the trench 44. Thus, in this embodiment, the initial lateral extent of the trench is reduced one time, so that x=1.

Figure 18:
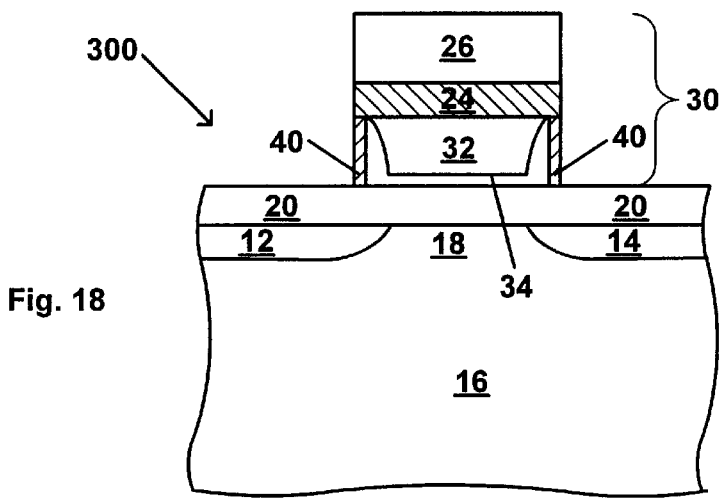
FIG. 18 illustrates, in cross-section, a floating gate flash memory device in accordance with still another embodiment of the present invention, including a metal floating gate and barrier layer, but no sidewall/spacers, no second sidewalls and no reverse tunnel dielectric layer, in accordance with an embodiment of the process shown in FIG. 15.

FIG. 18 illustrates, in cross-section, a floating gate flash memory device 300 in accordance with still another embodiment of the present invention, including a metal floating gate 32 and a barrier layer 34, and but no sidewall/spacers, no second sidewalls and no reverse tunnel dielectric layer, in accordance with an embodiment of the process shown in FIG. 15.

Figure 16:
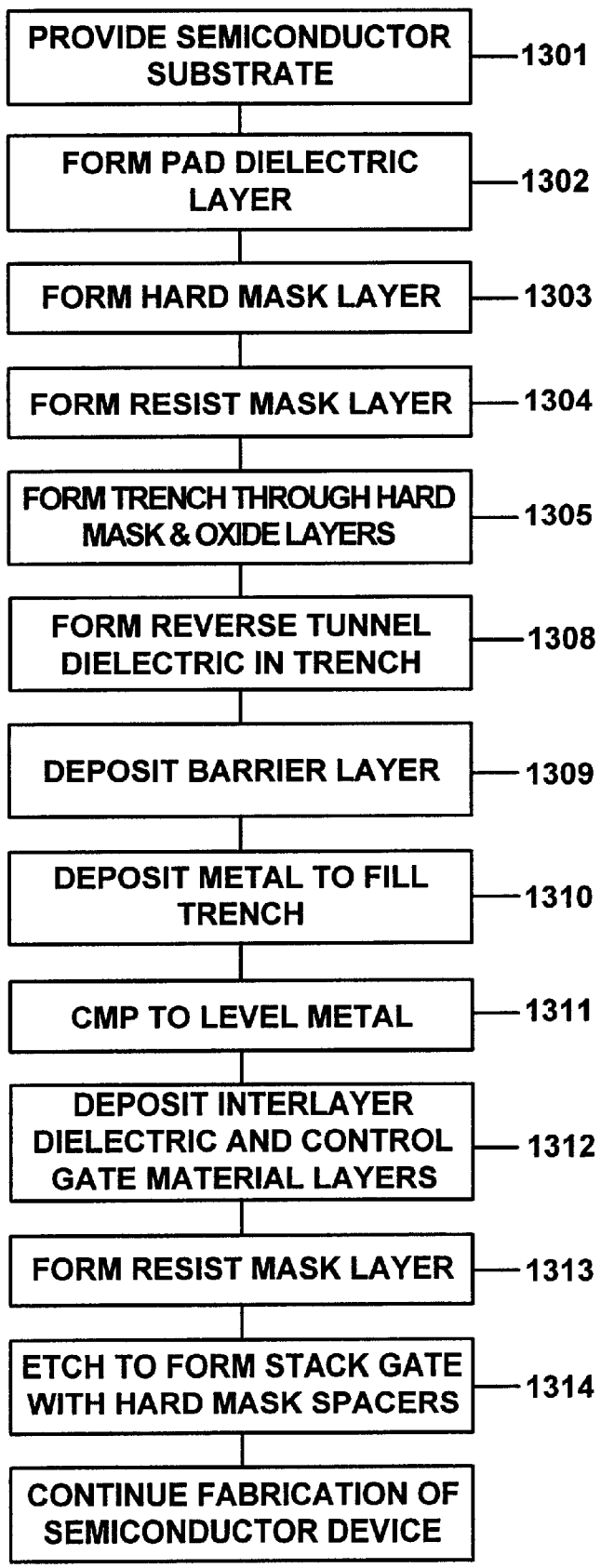
FIG. 16 is a schematic flow diagram showing steps of the process in accordance with yet another embodiment of the present invention.

FIG. 16 is a schematic flow diagram showing steps of the process in accordance with yet another embodiment of the present invention. In the embodiment shown in FIG. 16, the step 1305 etches through both the hard mask layer 40 and the pad oxide layer 20, and a reverse tunnel dielectric layer 28 is formed, in a step 1308. In this embodiment, the initial trench 44, formed through both the hard mask layer 40 and the pad oxide layer 20, has an initial lateral extent $L_i$, which is reduced only by formation of the barrier layer 34 in a step 1309. Thus, the embodiment shown in FIG. 16 omits steps 1306 and 1307. This embodiment includes formation of a barrier layer 34 in step 1309 and a metal floating gate material 32 in step 1310. As disclosed above, in this embodiment, the barrier layer 34 forms sidewalls which reduce the initial lateral extent $L_i$ of the trench 44. Thus, in this embodiment, the initial lateral extent of the trench is reduced one time, so that x=1.

Figure 19:
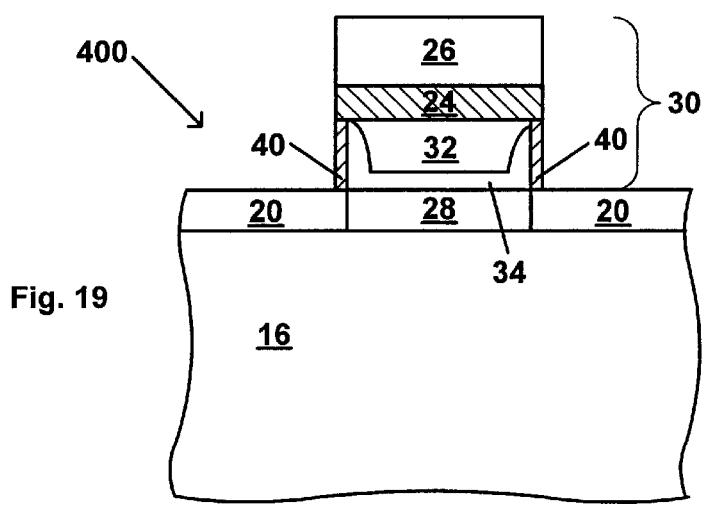
FIG. 19 illustrates, in cross-section, a floating gate flash memory device in accordance with yet another embodiment of the present invention, including a metal floating gate and barrier layer, and a reverse tunnel dielectric layer, but no sidewall/spacers or second sidewalls, in accordance with an embodiment of the process shown in FIG. 16.

FIG. 19 illustrates, in cross-section, a floating gate flash memory device 400 in accordance with yet another embodiment of the present invention, including a metal floating gate 32, a barrier layer 34 and a reverse tunnel dielectric layer 28, but no sidewall/spacers or second sidewalls, in accordance with an embodiment of the process shown in FIG. 16.

Following formation of the stack gate structure 30 shown in FIGS. 2, 17, 18 and 19, fabrication of the floating gate flash memory device continues, as indicated in the final step of FIGS. 13–16.

For example, in one embodiment, fabrication of the floating gate flash memory device may include annealing the device in order to densify the silicon dioxide and/or high-K or composite dielectric material layers and/or to further form the composite dielectric material of any or all of the dielectric layers, in addition to formation of interconnects, etc. In another embodiment, fabrication of the floating gate flash memory device may include deposition or formation of a protective or cap layer, such as the layer 50 shown in FIG. 2.

Figure 20:
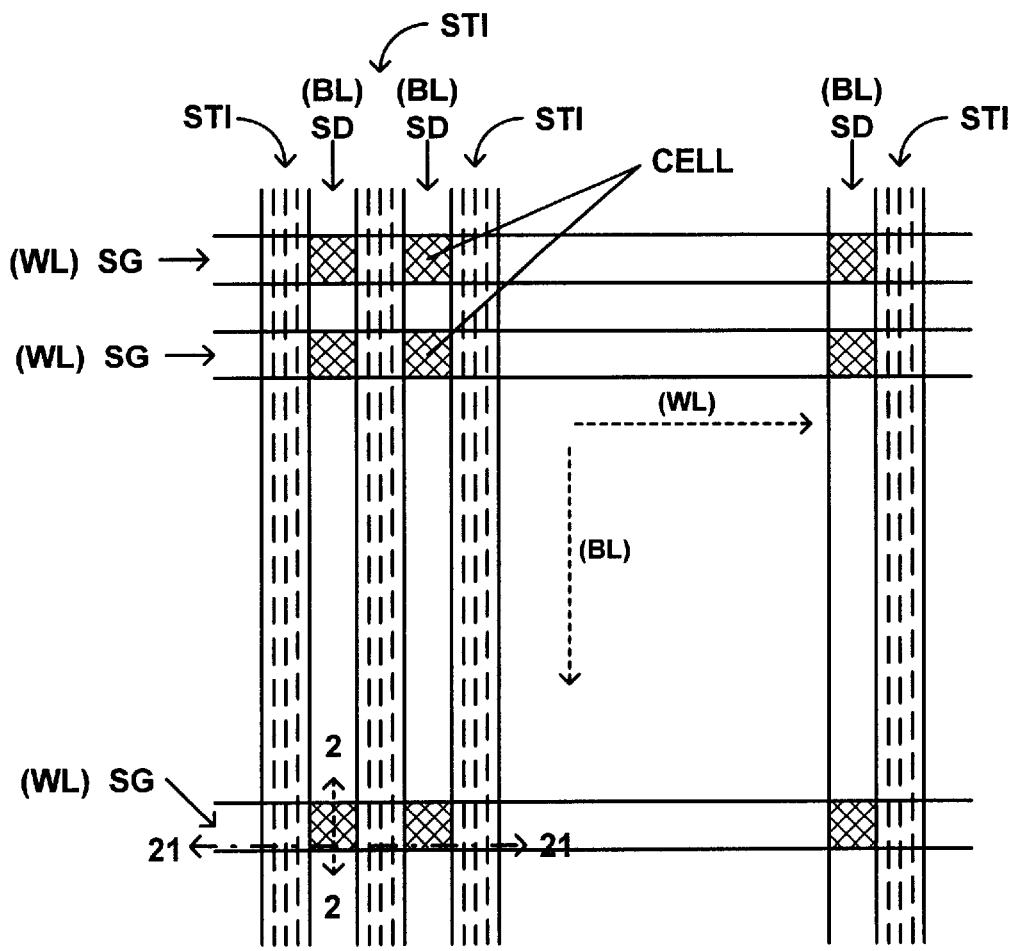
FIG. 20 is a plan view of the arrangement of the bitline and the wordline, and showing the location of a typical cell, in one embodiment of the present invention.

FIG. 20 is a plan view of the arrangement of the bitline and the wordline, and showing the location of a typical cell, in one embodiment of the present invention. As shown in FIG. 20, the stack gate 30 of the present invention is in the wordline plane, while the source/drain 12,14 are in the bitline plane. As indicated in FIG. 20, in one embodiment of the present invention, each cell is isolated from adjacent neighboring cells by a shallow trench isolation (STI) structure. In the embodiment shown in FIG. 20, the STI structures are arrayed in the bitline direction.

Figure 21:
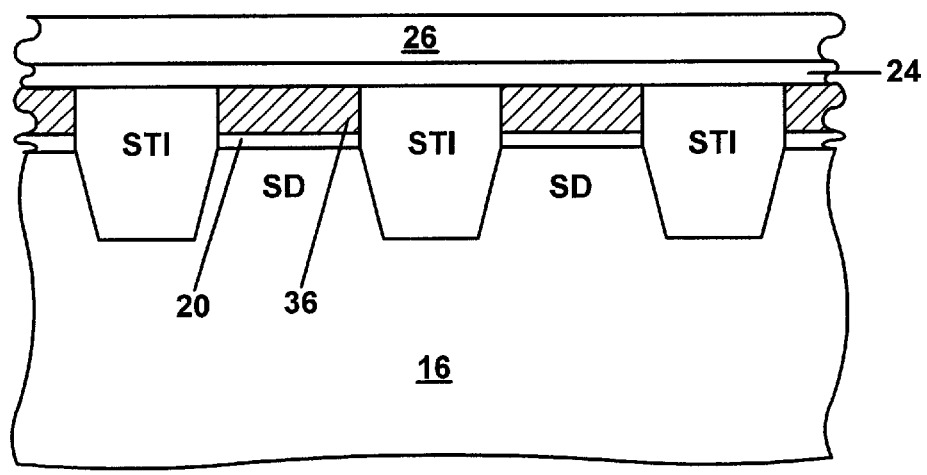
FIG. 21 is a schematic cross-sectional view of a device in accordance with the present invention along the wordline direction at line 21—21 of FIG. 20, showing the arrangement of a portion of the stack gate and an STI trench separating adjacent cells, in one embodiment of the present invention.

FIG. 21 is a schematic cross-sectional view of a device in accordance with the present invention along the wordline direction, schematically depicting a sectional view at line 21—21 of FIG. 20. FIG. 21 schematically depicts the arrangement of a portion of the stack gate including the sidewall/spacer 36 and the pad dielectric layer 20, and a series of STI trenches separating adjacent cells, in one embodiment of the present invention. As shown in FIG. 21, in this embodiment, the floating gate flash memory cell will be "buried" beneath the interlayer dielectric layer 24 and the control gate layer 26.

In one embodiment, the STI trench is formed by conventional methods, filled with a suitable trench fill material and is then polished by CMP to align the upper surface of the STI trench fill material with the upper surface of the hard mask layer 40. In one embodiment, the STI trench fill material is deposited by a suitable deposition method, such as one of the previously described CVD methods. In one embodiment, the STI trench fill material comprises a standard-K dielectric material. In another embodiment, the STI trench fill material comprises a low-K dielectric material, such as low-density or porous silicon dioxide. In other embodiments, the low-K dielectric material may be or comprise other known low-K dielectric materials, such as SiOF, fluorosilicate glass (FSG), hydrogen silsesquioxane (HSQ), fluorinated polysilicon, polyphenylquinoxaline polymer, fluoropolyimide, amorphous fluorocarbon (a-C:F), methylpolysiloxane (MPS) and polyarylene ether (PAE). In one embodiment, the low-K dielectric material has a K value in the range from about 1.05 up to about 3.9, and in one embodiment, from about 2 to about 3.5. As is known in the art, a low-K dielectric material provides better electrical isolation than a higher-K dielectric material.

There has been disclosed in accordance with the invention a process for fabricating a floating gate flash memory device, which provides the advantages set forth above. As noted above, the process of the invention is also applicable to other semiconductor devices which include a floating gate structure which is desired to be formed at reduced dimensions.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the materials, thicknesses or methods of deposition of the individual layers may be varied from that described herein. In another variation, an interfacial barrier layer may be added as appropriate. It is therefore intended to include within the invention all such variations and modifications that fall within the scope of the appended claims and equivalents thereof.

INDUSTRIAL APPLICABILITY

Thus, in accordance with the present invention, a novel floating gate flash memory device including a floating gate structure having reduced dimensions is provided which may be fabricated by the process described. The novel device may further include a reverse tunnel dielectric layer which may be selectively fabricated to provide a tunnel layer free of interface states that could provide charge leakage paths within the device. In addition, in appropriate embodiments, the novel device may further include a barrier layer which prevents migration of the metal of the metal floating gate into adjacent structures. The present invention may provide advantages such as (1) reduced size of the floating gate and the stack gate resulting in reduced pitch of the memory cell; (2) a floating gate workfunction in the range from about 4 to about 5.5 eV; (3) a reduction of the number of process steps; (4) improved data retention and reliability; (5) improved coupling between the control gate electrode and the floating gate electrode; and (6) reduction of equivalent oxide thickness of the dielectric layers by use of high-K dielectric materials. The present invention includes an efficient process which may be carried out in a single device, such as a cluster tool. Thus, the present invention provides an advance in floating gate flash memory device fabrication technology, and ensures proper functioning of the floating gate, while providing dielectric separation of the control gate electrode from the floating gate electrode and proper dielectric separation of the gate stack from the underlying semiconductor substrate in a floating gate flash memory device, while at the same time providing distinct process and economic advantages. Although described in terms of, and particularly applicable to, floating gate flash memory devices, the present invention is broadly applicable to fabrication of any semiconductor device including a metal structure having reduced dimensions.

What is claimed is:

1. A process for fabrication of a floating gate flash memory device comprising:

providing a semiconductor substrate;

forming a pad dielectric layer overlying the substrate;

forming a hard mask layer overlying the pad dielectric layer;

forming an initial trench through the hard mask layer and the pad dielectric layer, wherein the initial trench has an initial lateral extent $L_i$ defined by opposite hard mask sidewalls in the hard mask layer;

reducing the initial lateral extent $L_i$ of the initial trench to define a reduced trench having a reduced lateral extent $L_{rx}$, wherein x is at least one;

forming a reverse tunnel dielectric layer in the reduced trench; and filling the reduced trench with a floating gate material.

2. The process of claim 1, wherein the step of reducing the lateral extent of the initial trench comprises forming sidewall/spacers, to reduce the initial lateral extent $L_i$ to a first reduced lateral extent, $L_{r1}$.

3. The process of claim 2, further comprising formation second sidewalls, to reduce the first reduced lateral extent $L_{r1}$ to a second reduced lateral extent, $L_{r2}$.

4. The process of claim 1, further comprising depositing a barrier layer prior to the step of filling.

5. The process of claim 4, wherein deposition of the barrier layer reduces the lateral extent of the trench.

6. The process of claim 4, wherein the barrier layer comprises at least one of RuTiN, TiN, TaN, TaSiN, TiW, WN, or a mixture or composite thereof.

7. The process of claim 1, further comprising etching to form a stack gate comprising a spacer formed from a portion of the hard mask layer.

8. The process of claim 1, wherein x=2 or 3.

9. The process of claim 1, wherein the floating gate material is a metal floating gate material.

10. The process of claim 9, wherein the metal floating gate material comprises one or more of $RuO_2$, Ru, Rh, Pd, Os, Ir and Pt, mixtures and alloys thereof and alloys comprising one or more of Ru, Rh, Pd, Os, Ir and Pt.

11. A process for fabrication of a floating gate flash memory device comprising:

providing a semiconductor substrate;

forming a pad dielectric layer overlying the substrate;

forming a hard mask layer overlying the pad dielectric layer;

forming an initial trench through the hard mask layer, wherein the initial trench has an initial lateral extent $L_i$ defined by opposite hard mask sidewalls in the hard mask layer;

reducing the initial lateral extent $L_i$ of the initial trench to define a reduced trench having a reduced lateral extent $L_{rx}$, wherein x is at least one; and filling the reduced trench with a metal floating gate material.

12. The process of claim 1, wherein the step of reducing the lateral extent of the initial trench comprises forming sidewall/spacers, to reduce the initial lateral extent $L_i$ to a first reduced lateral extent, $L_{r1}$.

13. The process of claim 12, further comprising formation second sidewalls, to reduce the first reduced lateral extent $L_{r1}$ to a second reduced lateral extent, $L_{r2}$.

14. The process of claim 11, further comprising depositing a barrier layer prior to the step of filling.

15. The process of claim 14, wherein deposition of the barrier layer reduces the lateral extent of the trench.

16. The process of claim 14, wherein the barrier layer comprises at least one of RuTiN, TiN, TaN, TaSiN, TiW, WN, or a mixture or composite thereof.

17. The process of claim 11, further comprising etching to form a stack gate comprising a spacer formed from a portion of the hard mask layer.

18. The process of claim 11, wherein x=2 or 3.

19. The process of claim 11, wherein the metal floating gate material comprises one or more of $RuO_2$, Ru, Rh, Pd, Os, Ir and Pt, mixtures and alloys thereof and alloys comprising one or more of Ru, Rh, Pd, Os, Ir and Pt.

20. A process for fabrication of a floating gate flash memory device comprising:

providing a semiconductor substrate;

forming a pad dielectric layer overlying the substrate;

forming a hard mask layer overlying the pad dielectric layer;

forming an initial trench through the hard mask layer, wherein the initial trench has an initial lateral extent $L_i$ defined by opposite hard mask sidewalls in the hard mask layer;

depositing a barrier layer in the initial trench; and filling the reduced trench with a metal floating gate material.

21. The process of claim 20, wherein deposition of the barrier layer reduces the lateral extent of the trench.

22. The process of claim 20, wherein the barrier layer comprises at least one of RuTiN, TiN, TaN, TaSiN, TiW, WN, or a mixture or composite thereof.

23. The process of claim 20, further comprising etching to form a stack gate comprising a spacer formed from a portion of the hard mask layer.

24. The process of claim 20, wherein the metal floating gate material comprises one or more of $RuO_2$, Ru, Rh, Pd, Os, Ir and Pt, mixtures and alloys thereof and alloys comprising one or more of Ru, Rh, Pd, Os, Ir and Pt.

25. A process for fabrication of a floating gate flash memory device comprising:

providing a semiconductor substrate;

forming a pad dielectric layer overlying the substrate;

forming a hard mask layer overlying the pad dielectric layer;

forming an initial trench through the hard mask layer and the pad dielectric layer, wherein the initial trench has an initial lateral extent $L_i$ defined by opposite hard mask sidewalls in the hard mask layer;

forming a reverse tunnel dielectric layer in the reduced trench;

reducing the initial lateral extent $L_i$ of the initial trench to define a reduced trench having a reduced lateral extent $L_{r1}$; and filling the reduced trench with a metal floating gate material.

26. The process of claim 25, wherein deposition of the barrier layer reduces the lateral extent of the trench.

27. The process of claim 25, wherein the barrier layer comprises at least one of RuTiN, TiN, TaN, TaSiN, TiW, WN, or a mixture or composite thereof.

28. The process of claim 25, further comprising etching to form a stack gate comprising a spacer formed from a portion of the hard mask layer.

29. The process of claim 25, wherein the metal floating gate material comprises one or more of $RuO_2$, Ru, Rh, Pd, Os, Ir and Pt, mixtures and alloys thereof and alloys comprising one or more of Ru, Rh, Pd, Os, Ir and Pt.

30. A process for fabrication of a floating gate flash memory device comprising:

providing a semiconductor substrate;

forming a pad dielectric layer overlying the substrate;

forming a bard mask layer overlying the pad dielectric layer;

forming an initial trench through the hard mask layer and the pad dielectric layer, wherein the initial trench has an initial lateral extent $L_i$ defined by opposite hard mask sidewalls in the hard mask layer;

reducing the initial lateral extent $L_i$ of the initial trench by forming sidewall/spacers to define a reduced trench having a first reduced lateral extent, $L_{r1}$;

forming a reverse tunnel dielectric layer in the reduced trench;

depositing a barrier layer in the reduced trench; and filling the reduced trench with a floating gate material.

31. The process of claim 30, further comprising forming second sidewalls, to reduce the first reduced lateral extent $L_{r1}$ to a second reduced lateral extent, $L_{r2}$.

32. The process of claim 30, wherein deposition of the barrier layer reduces the lateral extent of the trench.

33. The process of claim 30, wherein the barrier layer comprises at least one of RuTiN, TiN, TaN, TaSiN, TiW, WN, or a mixture or composite thereof.

34. The process of claim 30, further comprising etching to form a stack gate comprising a spacer formed from a portion of the hard mask layer.

35. The process of claim 30, wherein the floating gate material is a metal floating gate material.

36. The process of claim 35, wherein the metal floating gate material comprises one or more of $RuO_2$, Ru, Rh, Pd, Os, Ir and Pt, mixtures and alloys thereof and alloys comprising one or more of Ru, Rh, Pd, Os, Ir and Pt.

37. A process for fabrication of a floating gate flash memory device comprising:

providing a semiconductor substrate;

forming a pad dielectric layer overlying the substrate;

forming a hard mask layer overlying the pad dielectric layer, forming an initial trench through the hard mask layer and the pad dielectric layer, wherein the initial trench has an initial lateral extent $L_i$ defined by opposite hard mask sidewalls in the hard mask layer;

reducing the initial lateral extent $L_i$ of the initial trench by forming sidewall/spacers to define a reduced trench having a first reduced lateral extent, $L_{r1}$;

forming second sidewalls, to reduce the first reduced lateral extent $L_{r1}$ to a second reduced lateral extent, $L_{r2}$;

forming a reverse tunnel dielectric layer in the reduced trench;

depositing a barrier layer in the reduced trench; and filling the reduced trench with a floating gate material.

38. The process of claim 37, wherein deposition of the barrier layer reduces the late extent of the trench.

39. The process of claim 37, wherein the barrier layer comprises at least one of RuTiN, TIN, TaN, TaSiN, TiW, WN, or a mixture or composite thereof.

40. The process of claim 37, further comprising etching to form a stack gate comprising a spacer formed from a portion of the hard mask layer.

41. The process of claim 37, wherein the floating gate material is a metal floating gate material.

42. The process of claim 41, wherein the metal floating gate material comprises one or more of $RuO_2$, Ru, Rh, Pd, Os, Ir and Pt, mixtures and alloys thereof and alloys comprising one or more of Ru, Rh, Pd, Os, Ir and Pt.

43. A process for fabrication of a floating gate flash memory device comprising:

providing a semiconductor substrate;

forming a pad dielectric layer overlying the substrate;

forming a had mask layer overlying the pad dielectric layer;

forming an initial trench through the hard mask layer and the pad dielectric layer, wherein the initial trench has an initial lateral extent $L_i$ defined by opposite hard mask sidewalls in the hard mask layer;

reducing the initial lateral extent $L_i$ of the initial trench by forming sidewall/spacers to define a reduced trench having a first reduced lateral extent, $L_{r1}$;

forming a reverse tunnel dielectric layer in the reduced trench, wherein the reverse tunnel dielectric layer comprises second sidewalls, to reduce the first reduced lateral extent $L_{r1}$ to a second reduced lateral extent, $L_{r2}$;

depositing a barrier layer in the reduced trench; and filling the reduced trench wit a floating gate material.

44. The process of claim 43, wherein the barrier layer comprises at least one of RuTiN, TiN, Ta, TaSiN, TiW, WN, or a mixture or composite thereof.

45. The process of claim 43, wherein the floating gate material comprises one or more of $RuO_2$, Ru, Rh, Pd, Os, Ir and Pt, mixtures and alloys thereof and alloys comprising one or more of Ru, Rh, Pd, Os, Ir and Pt.

46. The process of claim 43, further comprising etching to form a stack gate comprising a spacer formed from a portion of the hard mask layer.

47. A process for fabrication of a floating gate flash memory device comprising:

providing a semiconductor substrate;

forming a pad dielectric layer overlying the substrate;

forming a hard mask layer overlying the pad dielectric layer;

forming an initial trench through the bard mask layer and the pad dielectric layer, wherein the initial trench has an initial lateral extent $L_i$ defined by opposite bard mask sidewalls in the hard mask layer;

reducing the initial lateral extent $L_i$ of the initial trench by forming sidewall/spacers to define a reduced trench having a first reduced lateral extent, $L_{r1}$;

forming a reverse tunnel dielectric layer in the reduced trench, wherein the reverse tunnel dielectric layer comprises second sidewalls, to reduce the fist reduced lateral extent $L_{r1}$ to a second reduced lateral extent, $L_{r2}$; and filling the reduced trench with a floating gate material.

48. The process of claim 47, wherein the floating gate material comprises one or more of $RuO_2$, Ru, Rh, Pd, Os, Ir and Pt, mixtures and alloys thereof and alloys comprising one or more of Ru, Rh, Pd, Os, Ir and Pt.

49. The process of claim 47, further comprising etching to form a stack gate comprising a spacer formed from a portion of the hard mask layer.

* * * * *

UNITED STATES PATENT AND TRADEMARK OFFICE
CERTIFICATE OF CORRECTION

PATENT NO. : 6,660,588 B1
DATED : December 9, 2003
INVENTOR(S) : Yang et al.

It is certified that error appears in the above-identified patent and that said Letters Patent is hereby corrected as shown below:

Column 7,
Line 6, replace "mor" with -- more --

Column 17,
Line 44, replace "bard" with -- hard --

Column 24,
Line 66, replace "bard" with -- hard --

Column 26,
Line 7, replace "had" with -- hard --
Line 21, replace "wit" with -- with --
Line 23, replace "Ta" with -- TaN --
Lines 39 and 41, replace "bard" with -- hard --
Line 48, replace "fist" with -- first --

Signed and Sealed this

Twenty-seventh Day of July, 2004

JON W. DUDAS
*Acting Director of the United States Patent and Trademark Office*